(12) United States Patent
Torczynski

(10) Patent No.: US 6,193,601 B1
(45) Date of Patent: Feb. 27, 2001

(54) MODULE BAY WITH DIRECTED FLOW

(75) Inventor: John R. Torczynski, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/190,048

(22) Filed: Nov. 10, 1998

(51) Int. Cl.[7] .................................................. F24F 7/007
(52) U.S. Cl. .................................... 454/187; 55/385.4
(58) Field of Search ............................ 55/385.2, 385.4; 454/187, 237, 251, 252, 253, 284, 307, 309, 313

(56) References Cited

U.S. PATENT DOCUMENTS

| | | | |
|---|---|---|---|
| 4,880,581 | * 11/1989 | Dastoli et al. | 454/187 X |
| 5,525,106 | * 6/1996 | Iizuka et al. | 454/187 |
| 5,810,656 | * 9/1998 | Dowdell et al. | 454/187 X |
| 5,972,060 | * 10/1999 | O'Halloran et al. | 454/187 X |

* cited by examiner

Primary Examiner—Harold Joyce
(74) Attorney, Agent, or Firm—V. Gerald Grafe

(57) ABSTRACT

A module bay requires less cleanroom airflow. A shaped gas inlet passage can allow cleanroom air into the module bay with flow velocity preferentially directed toward contaminant rich portions of a processing module in the module bay. Preferential gas flow direction can more efficiently purge contaminants from appropriate portions of the module bay, allowing a reduced cleanroom air flow rate for contaminant removal. A shelf extending from an air inlet slit in one wall of a module bay can direct air flowing therethrough toward contaminant-rich portions of the module bay, such as a junction between a lid and base of a processing module.

16 Claims, 22 Drawing Sheets

(4 of 22 Drawing Sheet(s) Filed in Color)

CUT-AWAY VIEW

SIDE VIEW

MODULE BAY WITH DIRECTED FLOW

This invention was made with Government support under Contract DE-AC04-94AL85000 awarded by the U.S. Department of Energy. The Government has certain rights in the invention.

BACKGROUND OF THE INVENTION

This invention relates to the field of module bays, specifically directed air flow in module bays commonly used in semiconductor processing.

FIG. 1 is a schematic diagram of a conventional semiconductor processing apparatus, as seen from a top view. In the middle, there is a relatively open main bay for wafer transport, in which a strong downward flow of cleanroom air is maintained at all times. This flow sweeps any contaminant (e.g., heat, chemicals, aerosol particles) down to the floor, through which they are removed to the fab exhaust. This flow has a secondary purpose as well, which is to supply a purge flow for the vertically stacked module bays next to the main bay. Both of these processes serve to prevent contaminant transport between modules on different sides of the main bay.

FIGS. 2($a,b$) are schematic diagrams of a conventional configuration of vertically stacked module bays (e.g., B2) and the air flow in a main bay, as seen from perspective (FIG. 2$a$) and cut-away (FIG. 2$b$) views. The main bay and the module bays are separated by a solid wall W2, which has slit orifices (e.g., S2) connecting the module bays to the main bay. The flow used to purge the module bays is drawn through these slit orifices. For typical flow conditions, the average horizontal flow speed through each slit orifice is smaller than the vertical flow speed in the main bay.

FIGS. 3($a,b,c$) are schematic diagrams of a generic of the interior of a conventional module bay, as seen from several views. The module bay is a rectangular box within which a roughly cylindrical processing module is centrally placed. The processing module is composed of a base, a lid, a mechanism for raising and lowering the lid from the base (not shown), and fairly open support structures connecting the base to the module bay floor (not shown). Various chemical transport and electrical lines are also connected to the processing module. When a chemical or thermal process is performed for a wafer within the processing module, the processing module is sealed. An internal purge is used to remove contaminant from the processing module interior, but some contaminant may remain at the time the processing module is opened to unload the processed wafer and load the next wafer for processing. The module bay purge flow is intended to remove any contaminant from the processing module by sweeping it to the back of the module bay and exhausting it before any significant fraction can be transported out to the main bay during wafer unloading/loading.

In one conventional processing apparatus, there can be 20 vertically stacked module bays, containing vapor-prime, vacuum-bake, and chill-plate processing modules. The processing apparatus can also contain other processing modules such as spin-coaters and developers. Table 1 shows representative parameters, for air at 20° C. and 1 atm., for a conventional processing apparatus.

TABLE 1

| Quantity | Symbol | Value or Range |
|---|---|---|
| Kinematic viscosity | $\upsilon$ | 0.01 ft$^2$/min |
| Contaminant diffusivity | D | <0.02 ft$^2$/min |
| Purge flow rate | V' | 2–4 ft$^3$/min |
| External downward velocity | $U_E$ | 60 ft/min |
| Module bay width | $L_0$ | 16 in. |
| Module bay length | $L_1$ | 18 in. |
| Module bay height | $H_0$ | 7 in. |
| Lid bottom to base top | $H_1$ | 0.875 in. |
| Slit length | $S_0$ | 9 in. |
| Slit width | $W_0$ | 1:1 in. |
| Module diameter | $D_0$ | 10 in. |
| Exhaust area | A | 1 in.$^2$ |
| Slit face velocity | $U_0 = V'/(S_0 W_0)$ | 29–58 ft/min |
| Module bay face velocity | $U_M = V'/(L_0 H_0)$ | 2.5–5.0 ft/min |
| Contamination decay length | $L_M = (D/U_M)\ln(10)$ | <0.1–0.2 in. |
| Purge change-out time | $t_p = (H_0 L_0 L_1)/V'$ | 0.3–0.6 min |
| Reynolds number of jet | $Re = (W_0 U_0)/\upsilon = V'/(S_0 \upsilon)$ | 270–540 |

The module bays are configured in several columns with several module bays in each column. Each module bay is a rectangular box within which a roughly cylindrical processing module is placed (adjacent module bays can have different processing modules within them). These processing modules typically have a lid and a base and are closed during processing but open for wafer loading and unloading. An operational cycle occurs as follows: the processing module is opened, a robot arm carrying a wafer passes through the slit from the main bay into the module bay and loads the wafer into the processing module, the robot arm is withdrawn back into the main bay, the processing module is closed, the process is performed within the processing module (which may include some purging within the closed processing module), the processing module is opened, the robot arm enters the module bay and unloads the wafer from the processing module, and the robot arm is withdrawn back through the slit. There is also the possibility of lateral transfer of wafers between certain adjacent module bays by dedicated internal robot arms.

Many of the processes involve chemicals or levels of heat which could adversely impact other processes if transported to the vicinity of these processes. The spin-coaters and developers are especially sensitive to these types of contamination. To maintain process quality, it can be important to ensure that contaminant (chemical or heat) transport from the vertically stacked module bays to the spin-coaters and developers remains below prescribed levels, which are generally much more stringent than corresponding environmental, safety, and health requirements. Several strategies are typically employed to minimize contaminant transport. First, a continual downward flow of clean air is maintained at all times in the main bay. Contamination entering the main bay is thus swept downward and exhausted before reaching the sensitive processing modules. Second, transport between the vertically stacked module bays and the main bay is minimized by minimizing the contact areas, namely the slits through which the robot arm passes from the main bay into the module bays to load and unload wafers. Any contamination entering the main bay from the module bays passes through these slits. Third, purge flows are maintained from the main bay into the module bays at all times. These purge flows are intended to sweep any contamination to the back of the module bays, from which it is exhausted. The purge flow rate per module bay (shown in Table 1) in conventional practice can be approximately 4 ft$^3$/min, which yields a total purge flow rate (for 20 module bays) of 80 ft$^3$/min.

The contemporary cost of cleanroom air used to purge the module bays, including pre-use treatment to condition it for cleanroom applications and post-use treatment to render it benign for release to the environment, has been estimated to be roughly $2–$4 per CFM per year on average. The costs of certain waste streams such as acid exhaust can be considerably higher. Thus, reducing air-use requirements by operating changes and by improved designs is highly desirable both for current tools and for next-generation tools. This is particularly important for the semiconductor industry as emphasis shifts to larger wafers. A reduction in cleanroom air use directly reduces the cost of equipment operation. It also permits more equipment to be operated with the same total amount of air use, so additional equipment can be brought on-line without having to increase a fab's air-handling capability. Limitations on total air use may be mandated by law in the future for environmental, safety, or health reasons.

In present configurations of module bays with slit orifices, there is no device for controlling the direction of the flow entering the module bay from the main bay. This lack of control causes the purging to be far from optimal and susceptible to system perturbations. For example, an increase or decrease of the downward flow speed in the main bay will affect the angle at which the purge flow enters the module bay through the slit orifice. Similarly, a change in volume flow rate through the slit orifice will also change the entry angle. Such a change in entry angle will alter the purging of the module bay and (more importantly) of the processing module interior in an uncontrolled manner. Accordingly, there is a need for improved module bays and associated processing apparatus that effectively and predictably purge contaminants while requiring reduced cleanroom air flow.

SUMMARY OF THE INVENTION

A module bay according to the present invention requires less cleanroom air flow than prior module bays to minimize contamination. A shaped gas inlet passage can allow cleanroom air into the module bay with flow velocity preferentially directed toward contaminant rich portions of a processing module in the module bay. Preferential gas flow direction can more efficiently purge contaminants from appropriate portions of the module bay, allowing a reduced cleanroom air flow rate to achieve equivalent or improved contaminant removal as compared with conventional module bays.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The file of this patent contains at least one drawing executed in color. Copies of this patent with color drawing(s) will be provided by the Patent and Trademark Office upon request and payment of the necessary fee.

The accompanying drawings, which are incorporated into and form part of the specification, illustrate embodiments of the invention and, together with the description, serve to explain the principles of the invention.

FIGS. 6(a,b,c,d) present velocity-vector plots for four flow calculations with plates of the following lengths.

DETAILED DESCRIPTION OF THE INVENTION

A module bay according to the present invention requires less cleanroom air flow than prior module bays to minimize contamination. A shaped gas inlet passage can allow cleanroom air into the module bay with flow velocity preferentially directed toward contaminant rich portions of a processing module in the module bay. Preferential air flow direction can more efficiently purge contaminants from appropriate portions of the module bay, allowing a reduced cleanroom air flow rate to achieve equivalent or improved contaminant removal as compared with conventional module bays.

Figure 4A:
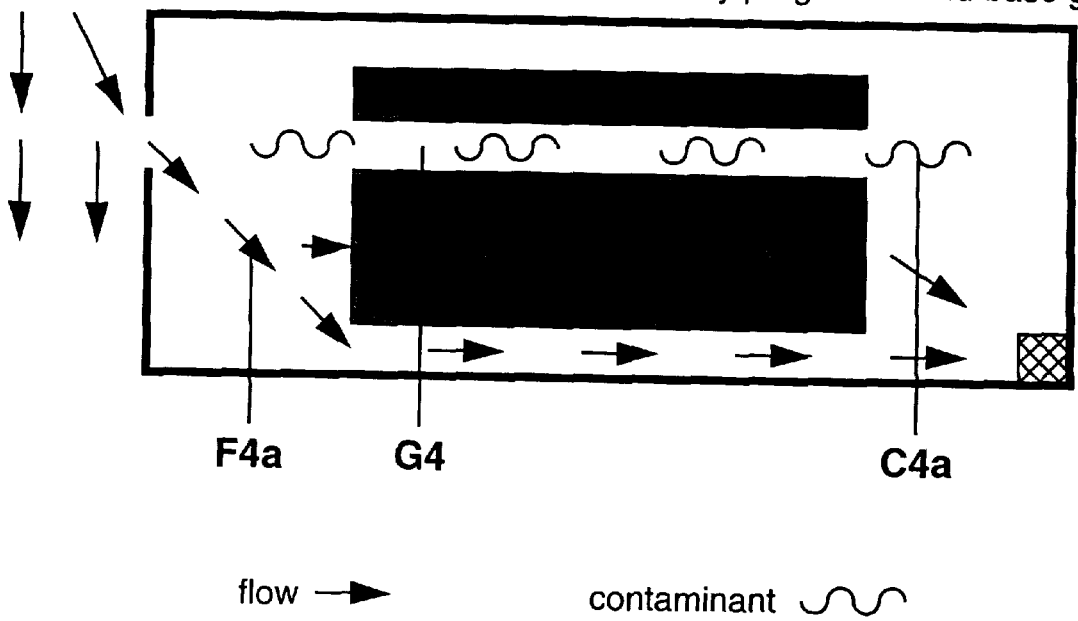
FIGS. 4(a,b) are schematic diagrams of a module bay, with the processing module shown in the open configuration.

FIGS. 4(a,b) are schematic diagrams of a module bay, with the processing module shown in the open configuration, in which it can release any residual contaminant to the interior of the module bay (no release occurs under normal circumstances when the module is closed). FIG. 4a shows typical airflow (e.g., F4a) and contaminant transport (e.g., C4a) patterns within a module bay interior in the absence of a passive flow-direction control device according to the present invention. The airflow does not enter the module bay horizontally but instead is directed strongly downward because of the strong downward flow in the main bay. Consequently, the airflow is not directed at the lid-base gap G4, the most contaminant-rich portion of the module bay. Instead, the airflow largely bypasses this portion and travels beneath the processing module base or around the sides of the processing module base before exiting into the exhaust. The airflow in the lid-base portion is nearly quiescent, so this portion is only weakly purged.

Figure 4B:
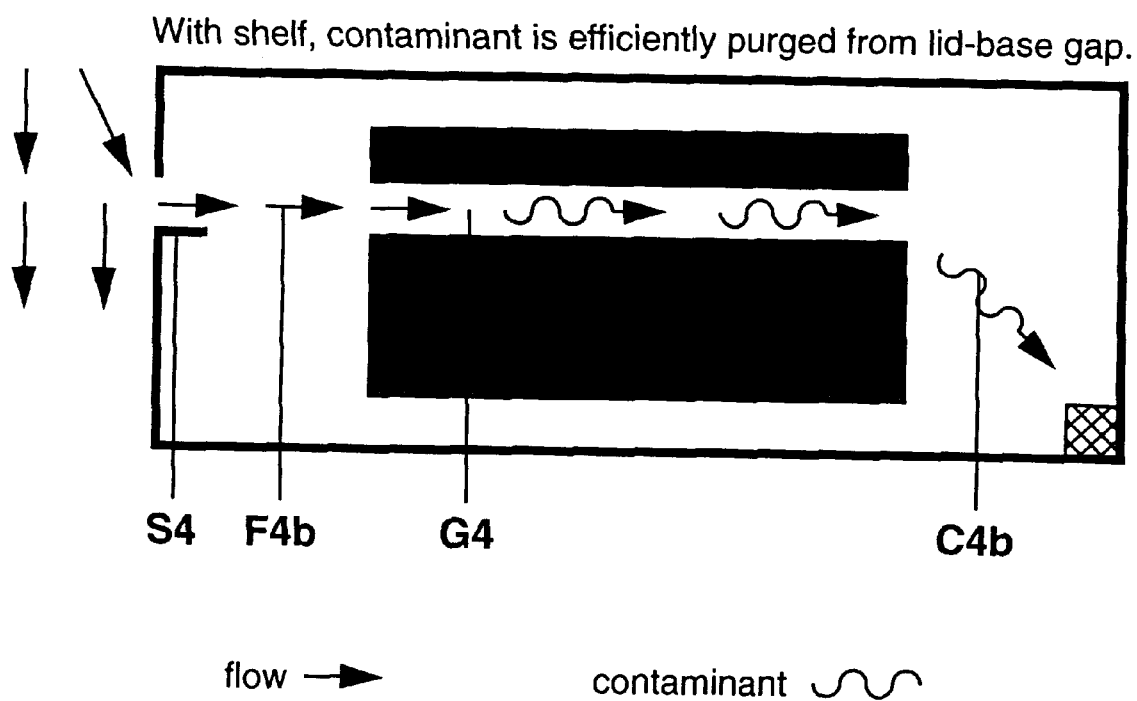
Figure 5A:
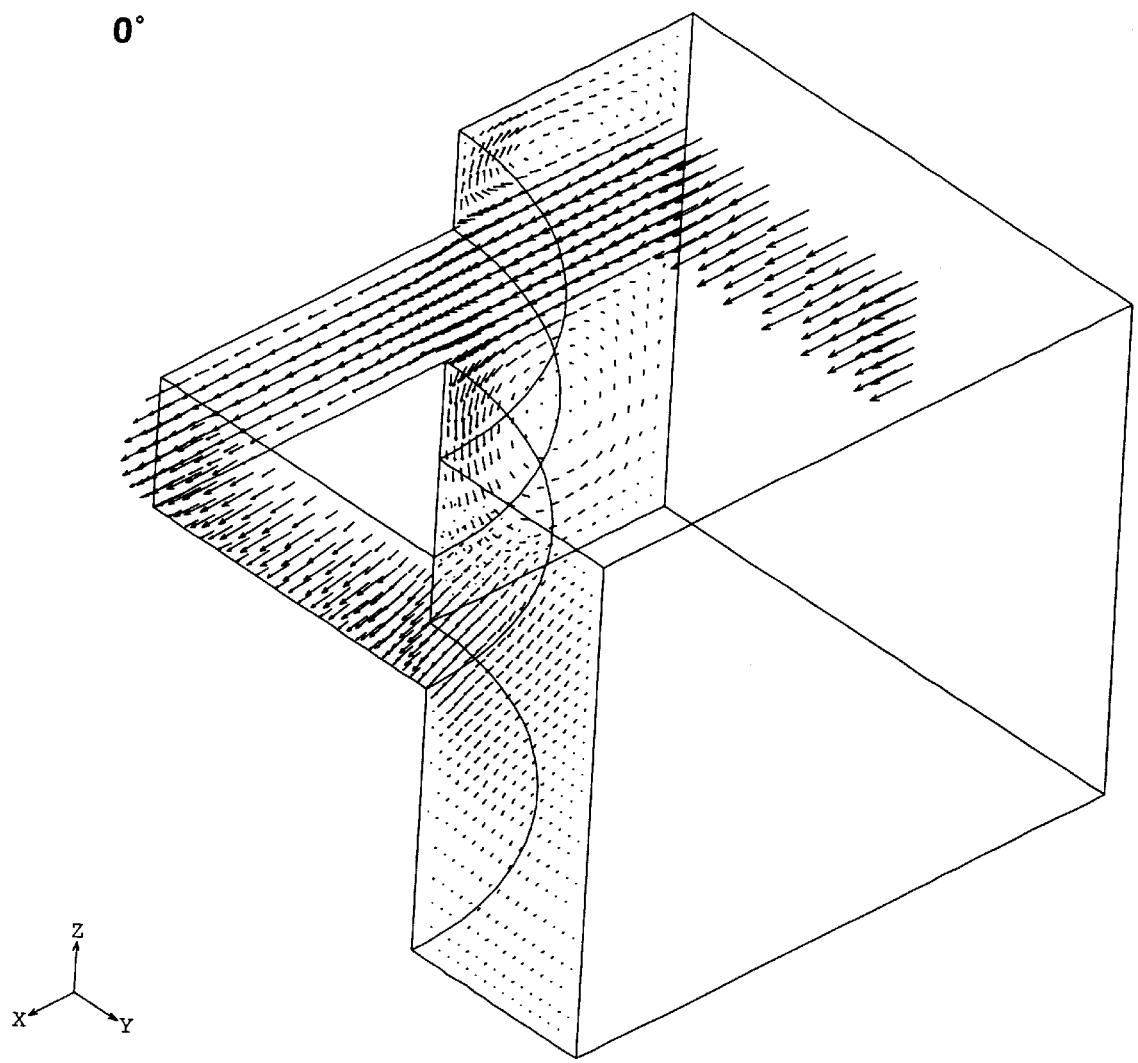
FIGS. 5(a,b,c,d) present the results of flow calculations with 4 ft$^3$/min entering a module bay through a slit.
Figure 5B:
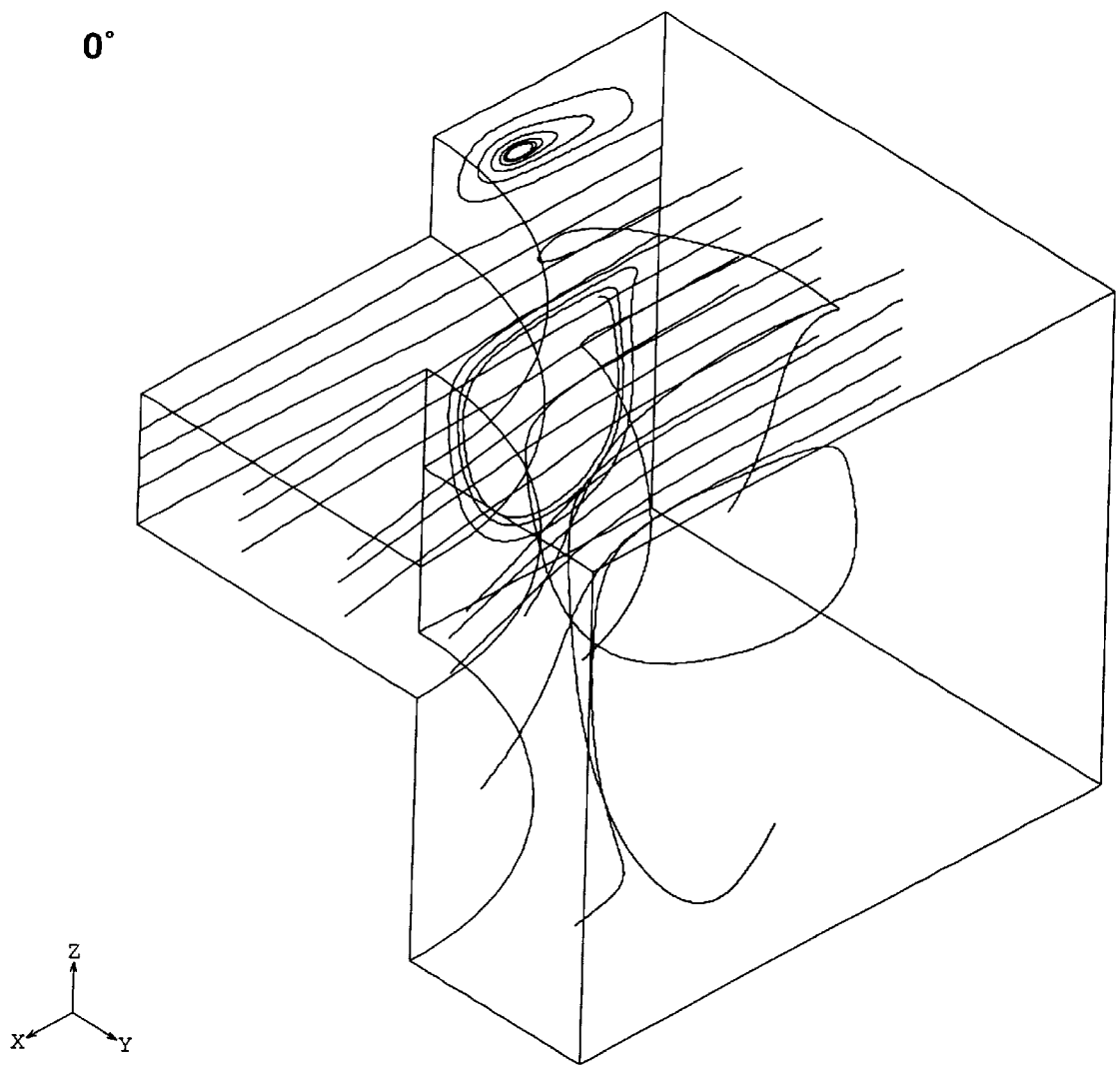
Figure 5C:
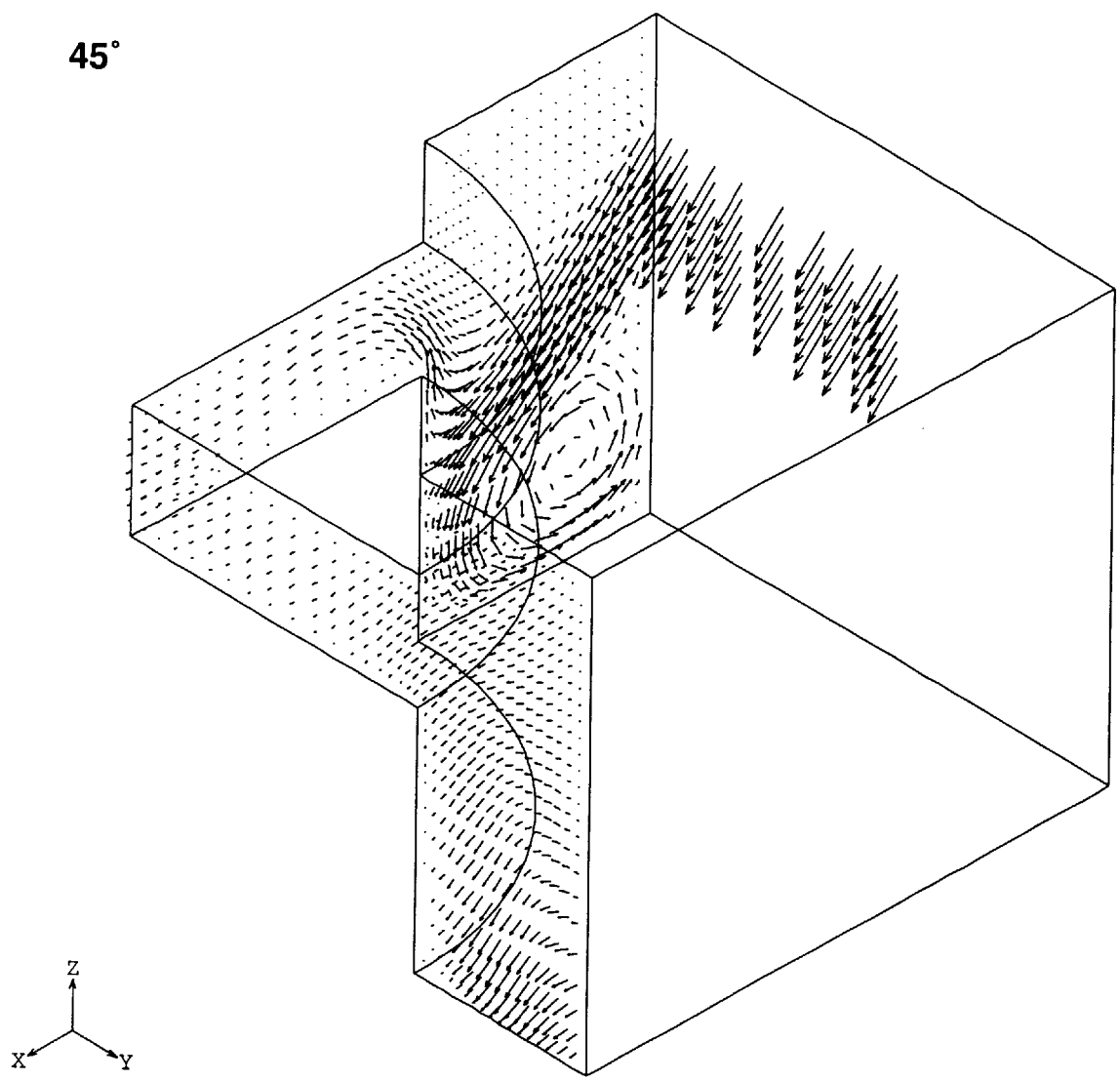
Figure 5D:
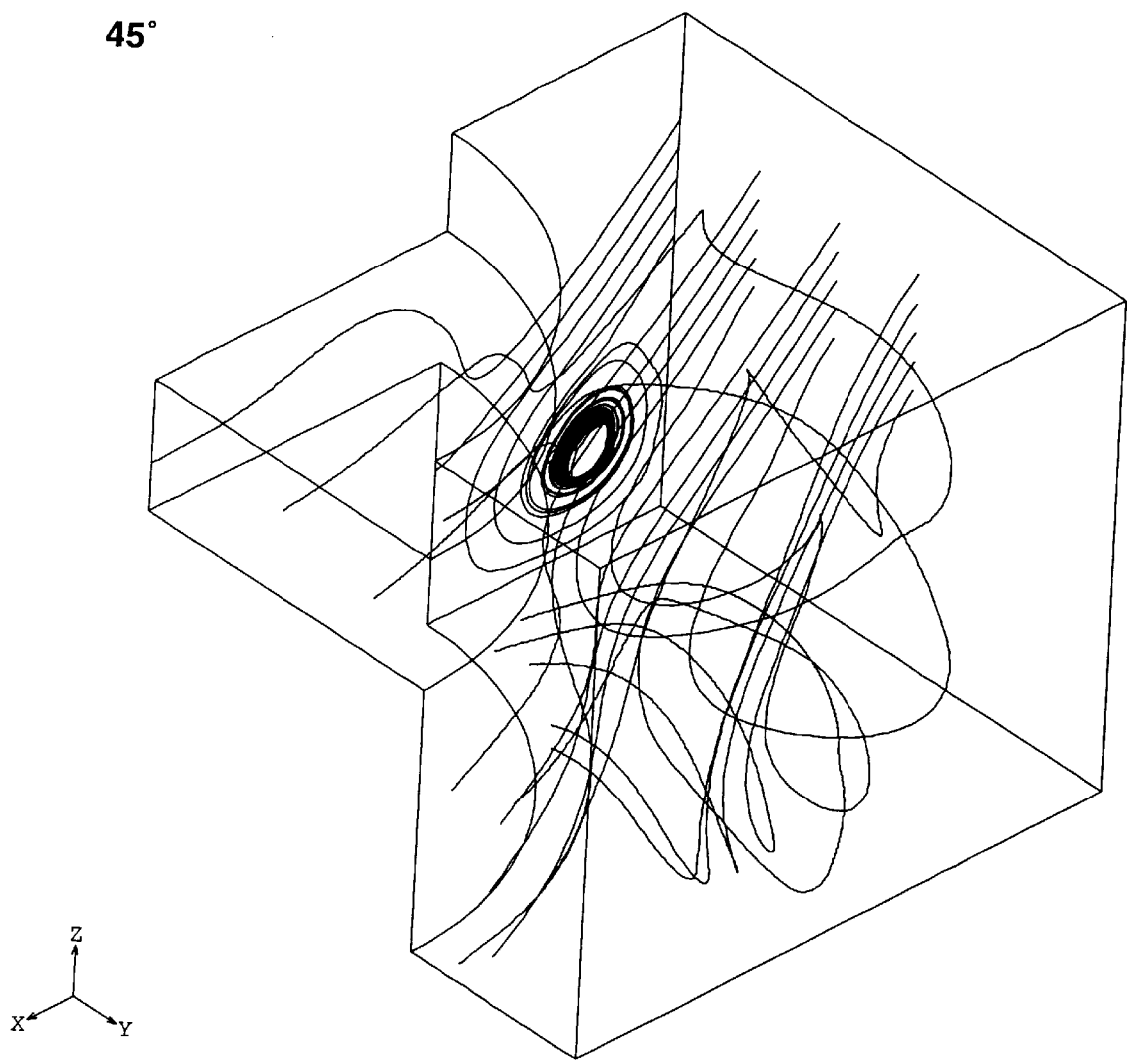

In contrast, FIG. 4b shows the airflow (e.g., F4b) and contaminant transport (e.g., C4b) patterns for a module bay with a flow-direction control device according to the present invention, in this example a small shelf S4 protruding horizontally into the open module bay from the lower edge of the slit orifice. The shelf turns the airflow and directs it horizontally directly into the lid-base gap G4, through which it passes before exiting into the exhaust. With the shelf present to direct the airflow, the bulk of the purge airflow passes through the lid-base gap G4, consequently strongly purging the most contaminant-rich portion of the module bay.

As described below, the performance of a particular shelf configuration can be fairly independent of the purge flow rate and the air velocity in the main bay over realistically wide ranges for each parameter. The module-bay geometry, however, significantly affects the preferred shelf configuration. A fairly good approximation to a preferred shelf is found by tilting the shelf such that it is aimed slightly below the midpoint of the opening to the lid-base gap. Similarly, a preferred length of the shelf is at least ½ the width of the slit orifice. Shelves with lengths approximately equal to the width of the slit orifice can provide more complete flow direction.

Using a shelf or other flow-direction control device to control the purge flow direction greatly reduces the amount of air required to purge the module bay by greatly increasing purging efficiency. This reduction is robust over realistically wide ranges of operating parameters. A preferred shelf configuration can be approximately determined in a straightforward fashion and more accurately determined by numerical flow calculations, as described below.

Analytical Assessment

The parameters provided in Table 1 can be used to assess certain features of the purging.

The total time $t_P$ required for the purge flow to complete one complete air change-out is approximated by the ratio of the module bay volume to the purge flow rate, as in Equation 1.

$$t_P = (H_0 L_0 L_1)/V' \quad \text{Equation 1}$$

Equation 1 yields 18 seconds for a purge flow of 4 ft³/min, and 36 seconds for a purge flow of 2 ft³/min. If the module bay is not empty as assumed in Equation 1, the actual change-out times can be somewhat shorter. Since the process times are around 1 min, essentially all contamination exterior to the module but interior to the module bay will be removed from the module bay while the process is ongoing and the module is closed so long as the flow is not badly maldistributed.

If the flow were uniformly distributed over the module bay face (of dimensions $H_0 \times L_0$) rather than entering via the slit, the contamination decay length $L_M$ (the upstream distance over which the contamination concentration decays by a factor of 10) can be determined by Equation 2 in terms of the contaminant species diffusivity D and the module bay face velocity $U_M$.

$$L_M = (D/U_M) \ln(10); \quad U_M = V'/(L_0 H_0) \quad \text{Equation 2}$$

Equation 2 yields values of less than 0.1–0.2 inch for purge flows of 4 or 2 ft³/min, where the inequality indicates that these values are upper bounds since an upper bound for the diffusivity was used in their calculation. To achieve a concentration reduction of 9 orders of magnitude and thereby guarantee upstream concentrations below 1 part per billion requires a separation of 9 $L_M$, or 1–2 in., between the contaminated region and the region upstream. If the distance between the upstream edge of the module and the module bay face is about 4 in., only about 1 ft³/min would be needed to maintain contaminant transport below acceptable levels if the flow were uniformly distributed rather than entering through a slit.

Several factors can affect the flow distribution in the module bay, however. First, the exhaust at the back of the module bay can be positioned asymmetrically with respect to the vertical plane defined by the dashed line in FIG. 2: it is located in one corner rather than directly behind the module. Second, the module bay geometry can be strongly three-dimensional: significant flow velocities can be produced in all three directions. Third, the direction of the flow entering the module bay through the slit can deviate significantly from horizontal ("flow vectoring"): the flow exterior to the module bay can be traveling at a downward velocity $U_E$ higher than the average flow velocity $U_0$ through the slit (for example, 60 ft/min compared to 29–58 ft/min for purge flows of 4 or 2 ft³/min). Fourth, the flow entering the module bay from the slit can contract into a jet substantially thinner than the slit ("jet contraction"): the jet Reynolds number $R_e = (W_0 U_0)/v = V'/(S_0 v)$ can be in the range of 270–540, so free-streamline potential flow can be approximately achieved near the slit. The impact of each factor on flow distribution and contaminant transport near the upstream edge of the module is discussed below.

Asymmetric Exhaust Placement

Figure 1:
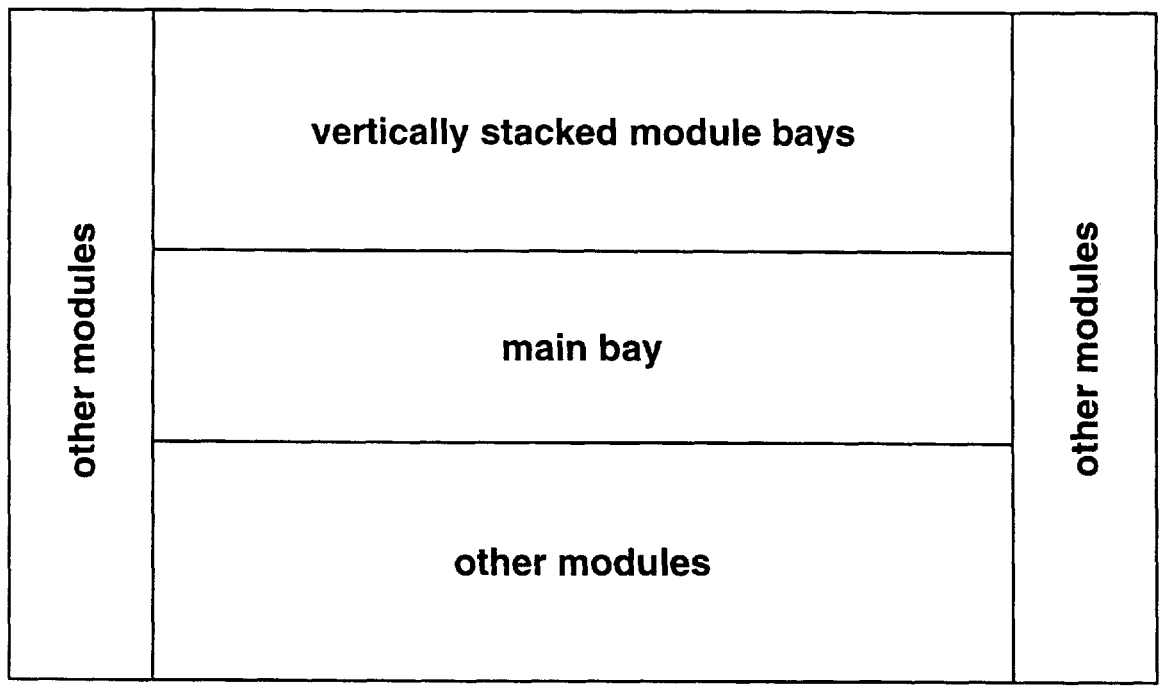
FIG. 1 is a schematic diagram of a conventional semiconductor processing apparatus.
Figure 2A:
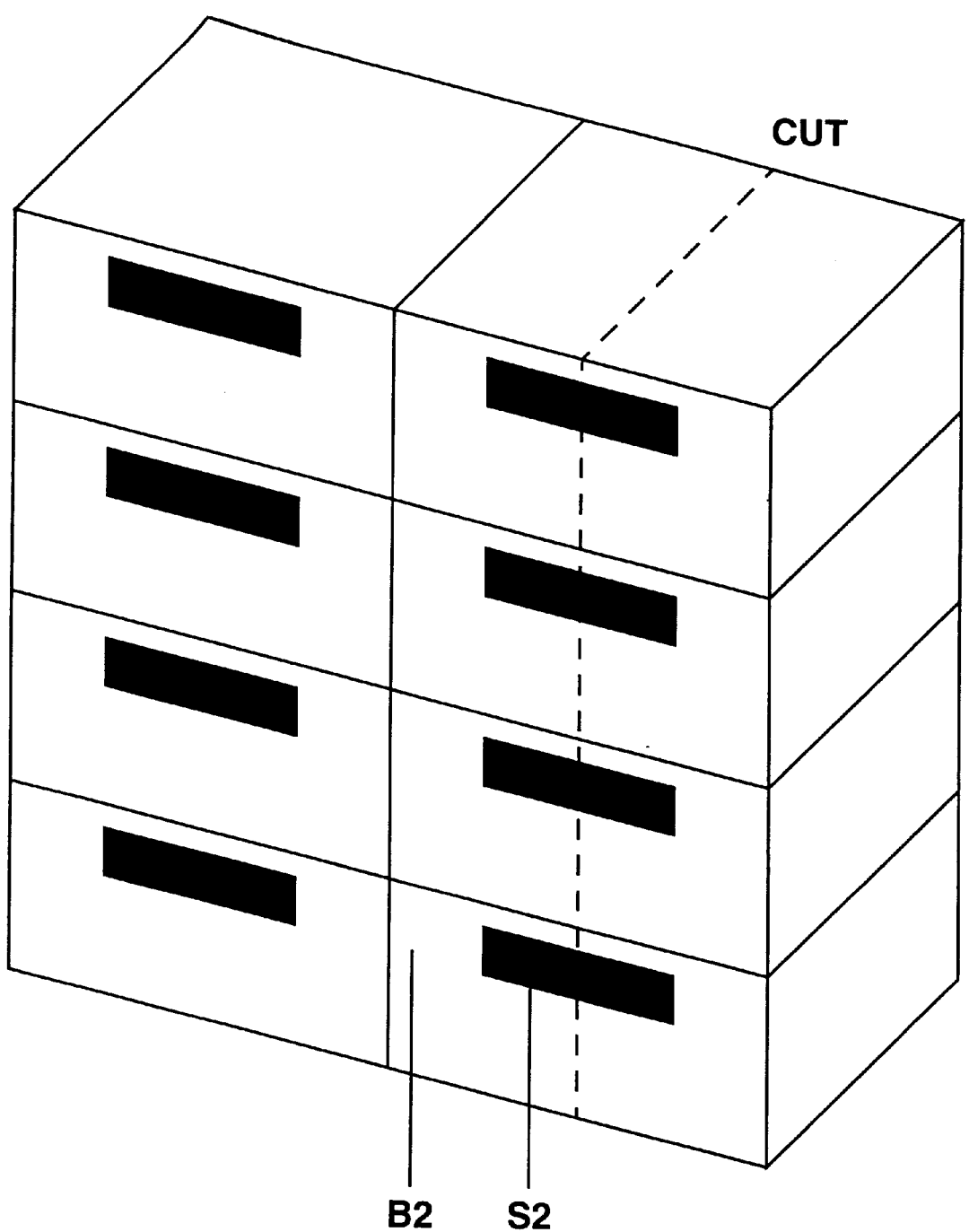
FIGS. 2(a,b) are schematic diagrams of a conventional configuration of vertically stacked module bays and the air flow in a main bay, as seen from perspective (FIG. 2a) and cut-away (FIG. 2b) views.
Figure 2B:
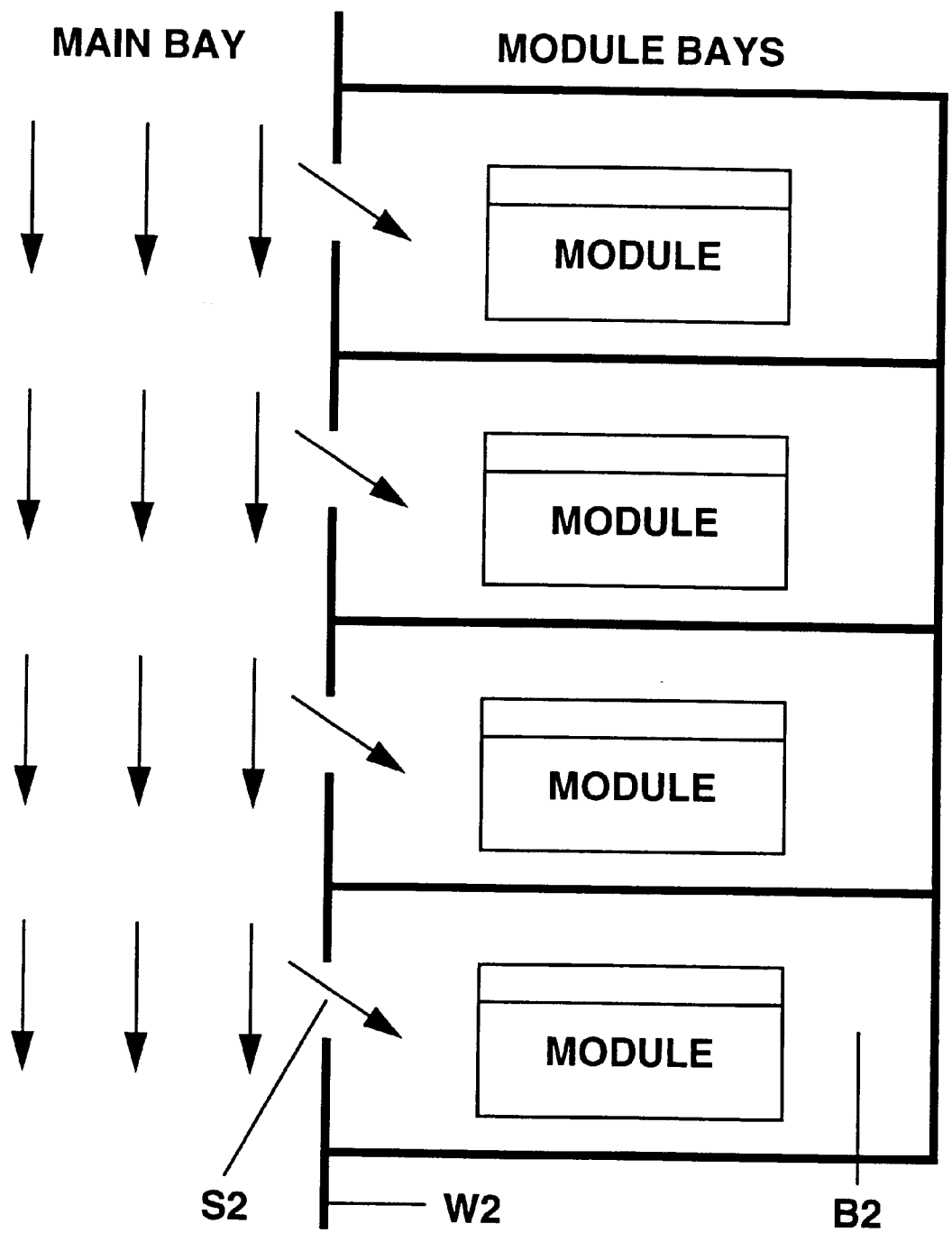
Figure 3A:
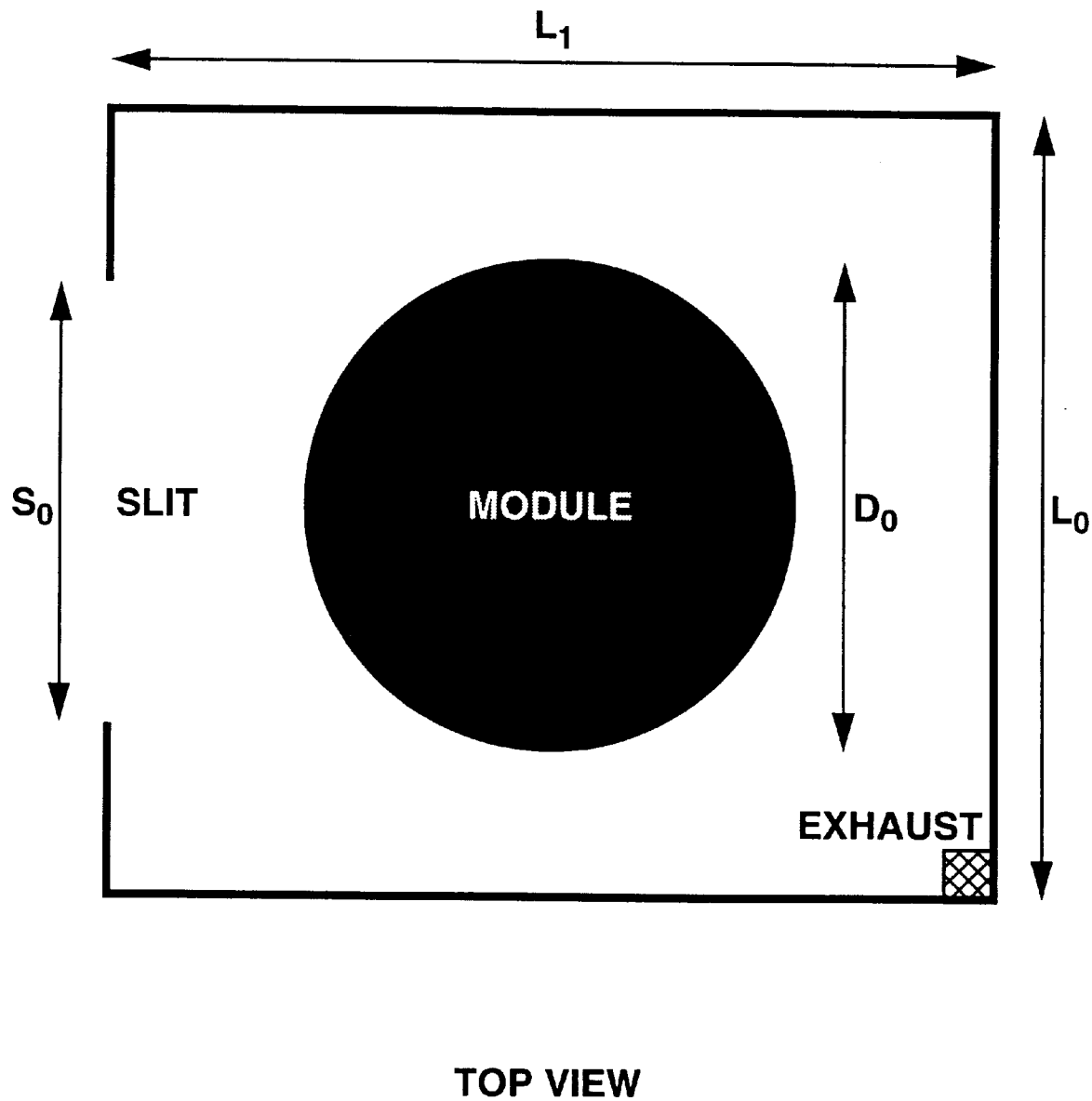
FIGS. 3(a,b,c) are schematic diagrams of a generic of the interior of a conventional module bay, as seen from several views.
Figure 3B:
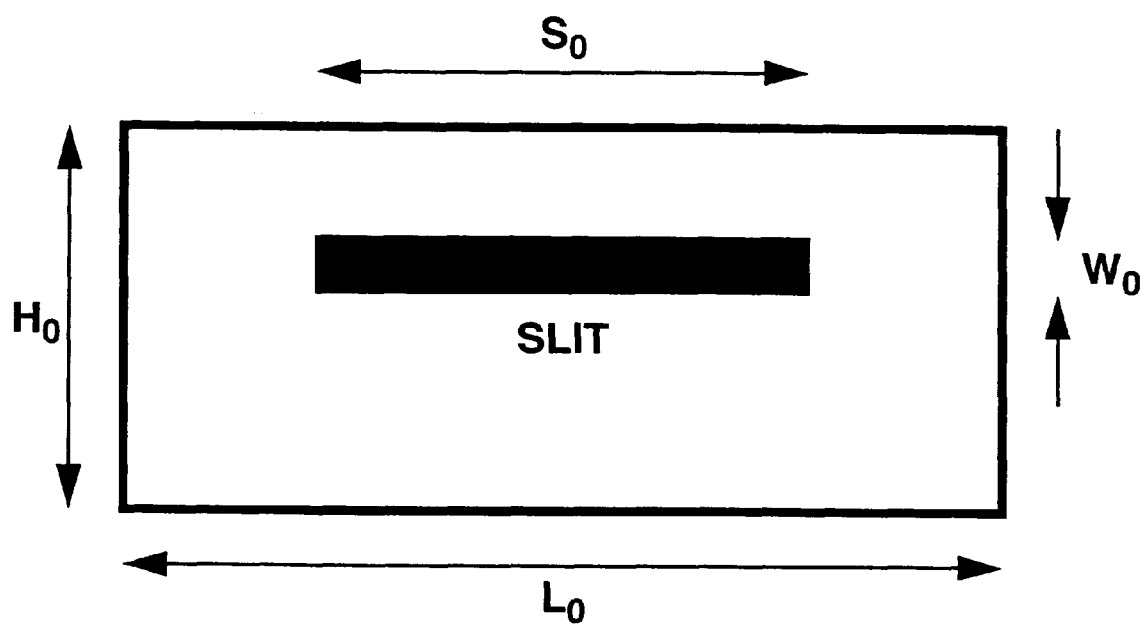
Figure 3C:
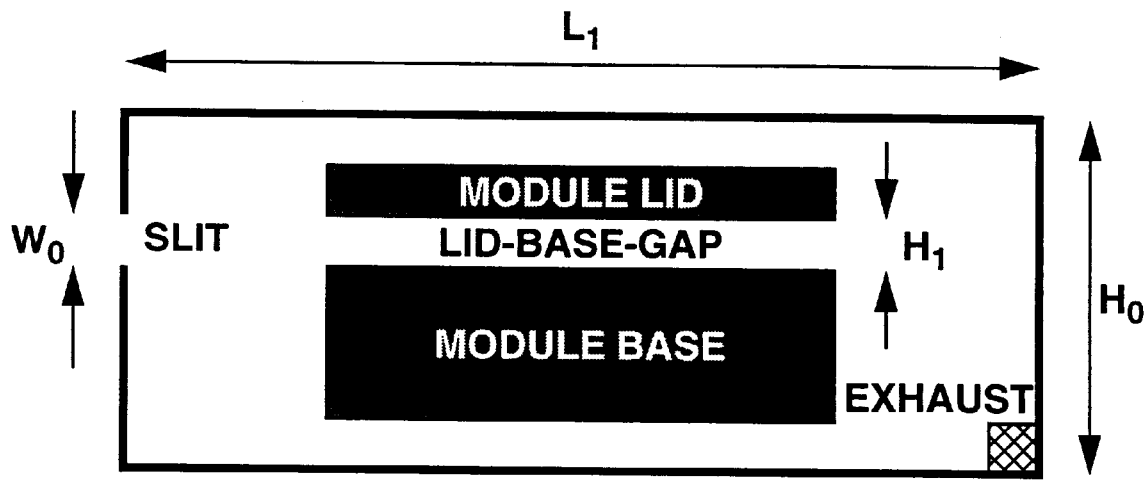

As shown in FIG. 3, the exhaust port for each module bay can be placed asymmetrically with respect to the vertical plane defined by the dashed line in FIG. 2 (in a corner at the back of the module bay rather than directly behind the module). This placement admits the possibility that flow asymmetry could occur: significantly more flow could travel around the processing module along the side nearest to the exhaust than along the side furthest from the exhaust. While significant asymmetry can result in the streamline patterns downstream of the processing module, it is the upstream portion of the processing module that contributes most to contamination transport. The asymmetric exhaust placement does not produce significant flow asymmetry in the upstream half of the module bay; consequently, it does not strongly affect contaminant transport back through the slit into the main bay of the processing apparatus.

Flow Three-Dimensionality

As shown in FIG. 3, the module bay geometry can be strongly three-dimensional. Flow can enter the module bay through a long thin horizontal slit and can encounter a vertically oriented roughly cylindrical object. Flow can pass through the gap between the lid and base of the processing module and through the many gaps between the processing module and the module bay walls (i.e. the floor, the ceiling, and the sides). The highest contamination can occur in the region between the base and the lid of the processing module; however, the base-to-lid gap can have a cross-sectional area that is typically less than 20% of the total cross-sectional area for the other regions combined. As a result, a significant amount of the purge flow can bypass the most highly contaminated region and thus not be effectively used to purge contamination from the module bay when the processing module is open.

To assess the effect of flow three-dimensionality on flow distribution, the code FIDAP was used to simulate this type of geometry. Three-dimensional flow simulations were performed on the upstream half of the module bay, and symmetry about the vertical plane defined by the dashed line in FIG. 2 was assumed. The geometric parameters were modified in a conservative fashion slightly from those of Table 1 as follows: no gaps were allowed between the processing module and the floor or ceiling; the slit and the gap between the lid and base extended from 4 in. to 6 in. A fairly coarse mesh was used to achieve results in a timely fashion (the nodal density can be ascertained from subsequent velocity-vector plots). This necessitated increasing the viscosity somewhat to improve convergence behavior. The basic flow behavior is not affected significantly by this increase since the Reynolds number was still sufficiently high, but the simulations in this section should be interpreted as only semi-quantitative.

FIGS. 5(a,b,c,d) present the results of flow calculations with 4 ft$^3$/min entering a module bay through a slit. The velocity distribution across the slit is taken to be uniform at the value required to yield the desired purge flow rate of 4 ft$^3$l/min, and the flow is taken to enter the module bay either perpendicularly (at a 0° angle in FIGS. 5(a,b)) or obliquely (at a 45° angle in FIGS. 5(c,d)) to the slit plane. The velocity-vector plots in FIGS. 5(a,c) show the flow entering through the slit, the flow along the vertical symmetry plane upstream of the processing module and between the lid and the base, and the flow at the outflow plane of the computational domain. Streamlines entering from the slit are also shown. For perpendicular entry as in FIG. 5b, most of the streamlines pass through the region between the lid and the base, which can be the region of highest contamination, although some streamlines do bypass this region and travel around the side of the module. For oblique entry as in FIG. 5d, the flow pattern is quite different. In this case, most of the streamlines travel downward at 45°, encounter the base of the processing module, are deflected laterally, travel with some swirling around the side of the processing module rather than through the gap between the lid and the base, and exit the computational domain near the module bay side wall. Thus, the flow between the lid and base is greatly reduced with oblique entry.

In both cases, the jet flow entering from the slit travels along relatively straight streamlines until it is about one jet width (here the slit width) upstream of the processing module. Since the Reynolds numbers of these flows are moderately high, pressure forces are large compared to viscous forces. Since the jet is not deflected up or down, the pressures above and below the jet must be comparable. This is because the pressure both below and above the jet can relieve laterally into the large open region beyond the end of the slit. The significance of this point is that, if two-dimensional fluid-flow and contaminant-transport simulations are performed because of the significantly lower computational effort required (as in the subsequent section), a comparable degree of pressure equilibration between the regions below and above the jet must be achieved to compute the jet direction correctly. Otherwise, the jet would be deflected by spurious pressure gradients not present in the real three-dimensional geometry, and the purging would not be computed accurately.

Figure 6A:
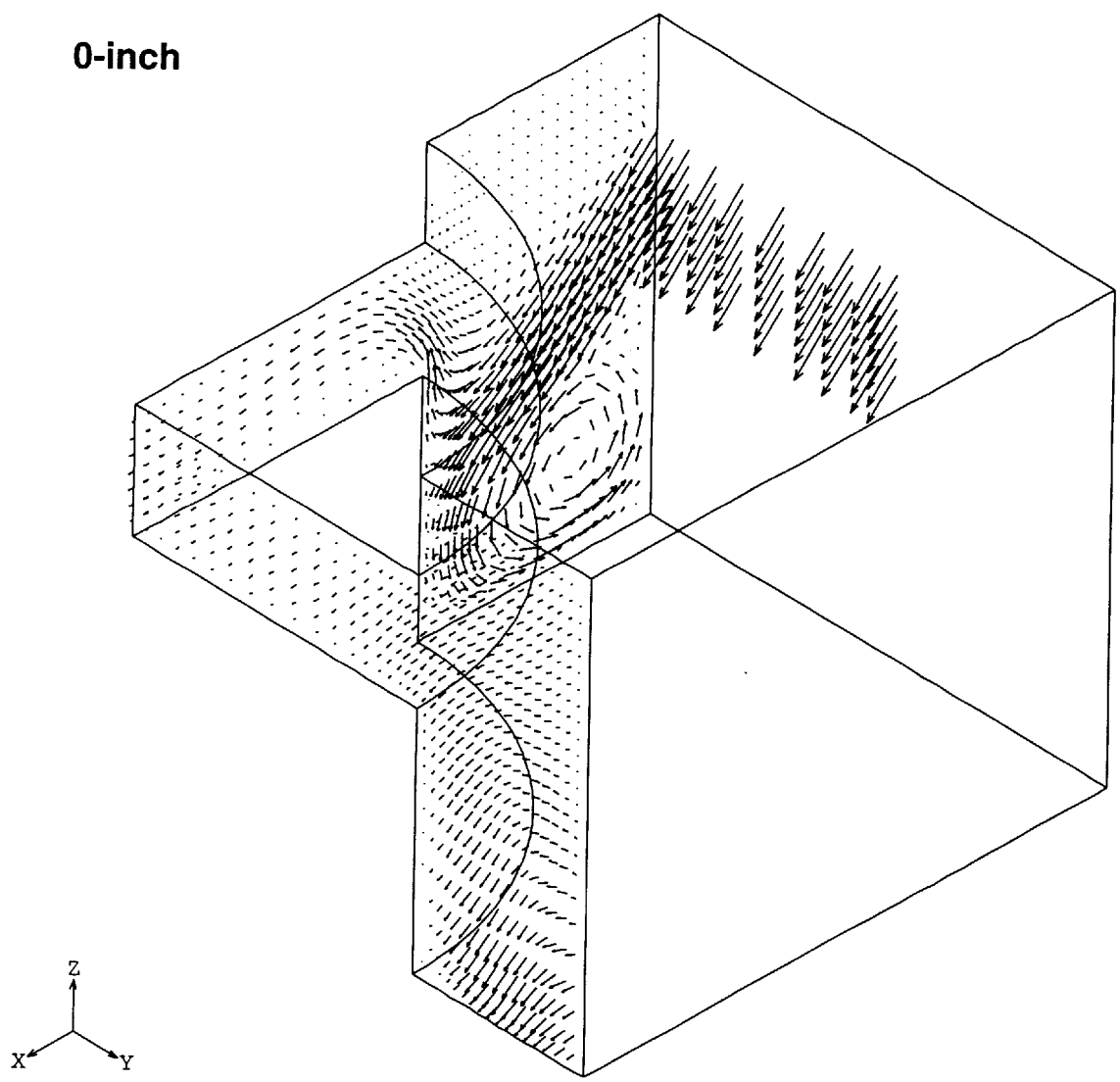
FIG. 6a shows a 0 in. plate (identical to FIG. 5a)
Figure 6B:
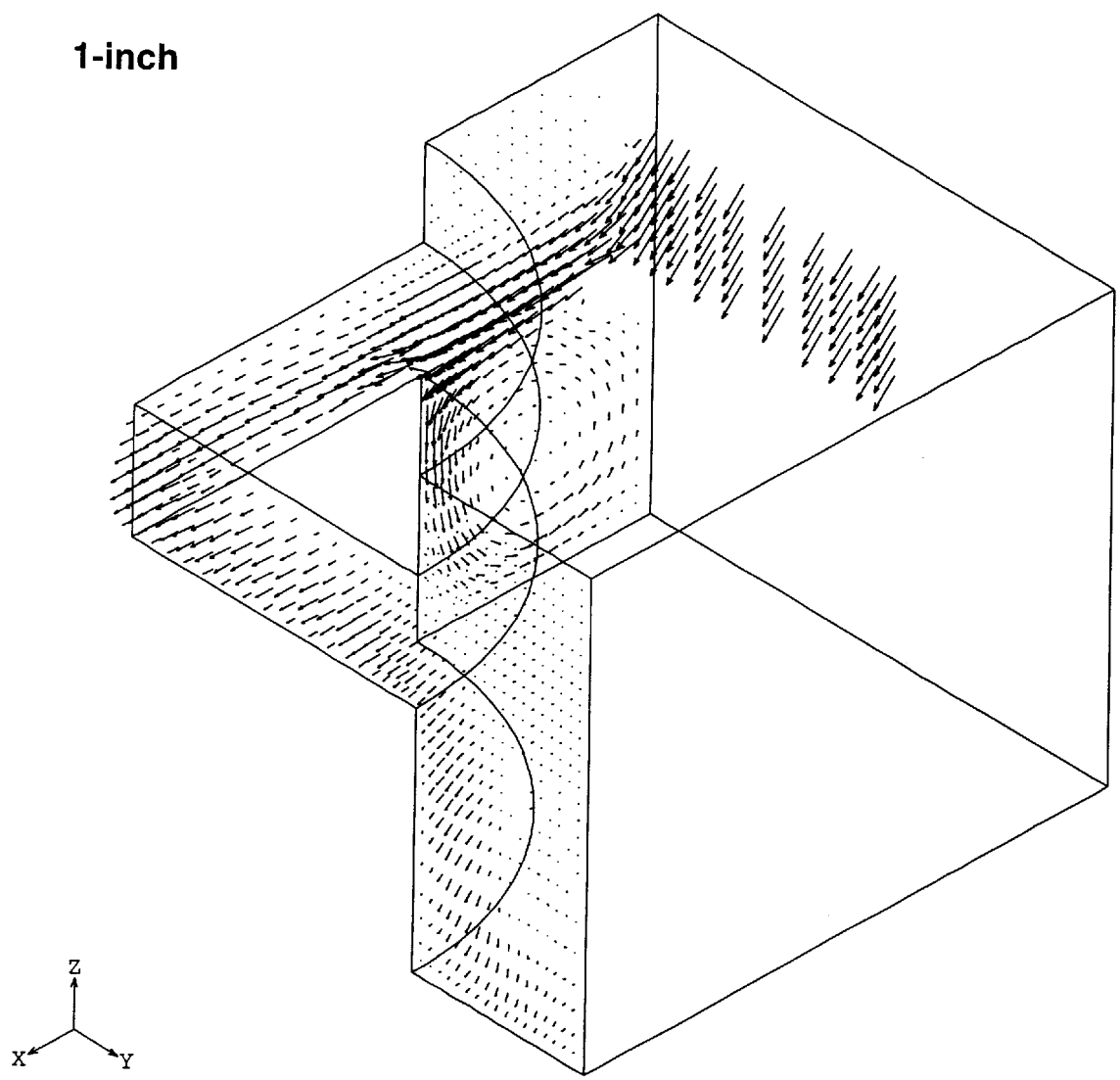
FIG. 6b shows a 1 in. plate.
Figure 6C:
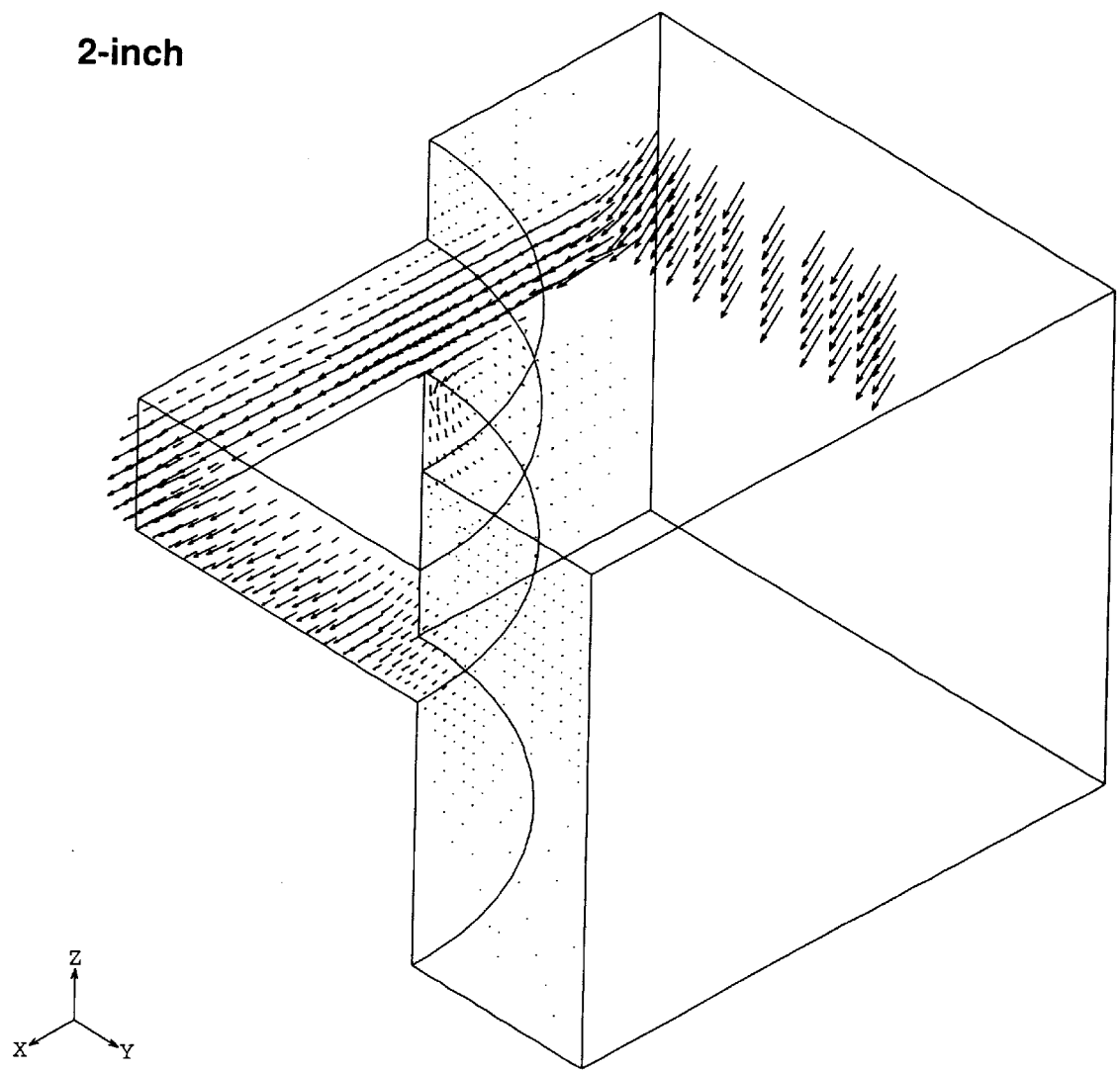
FIG. 6c shows a 2 in. plate.
Figure 6D:
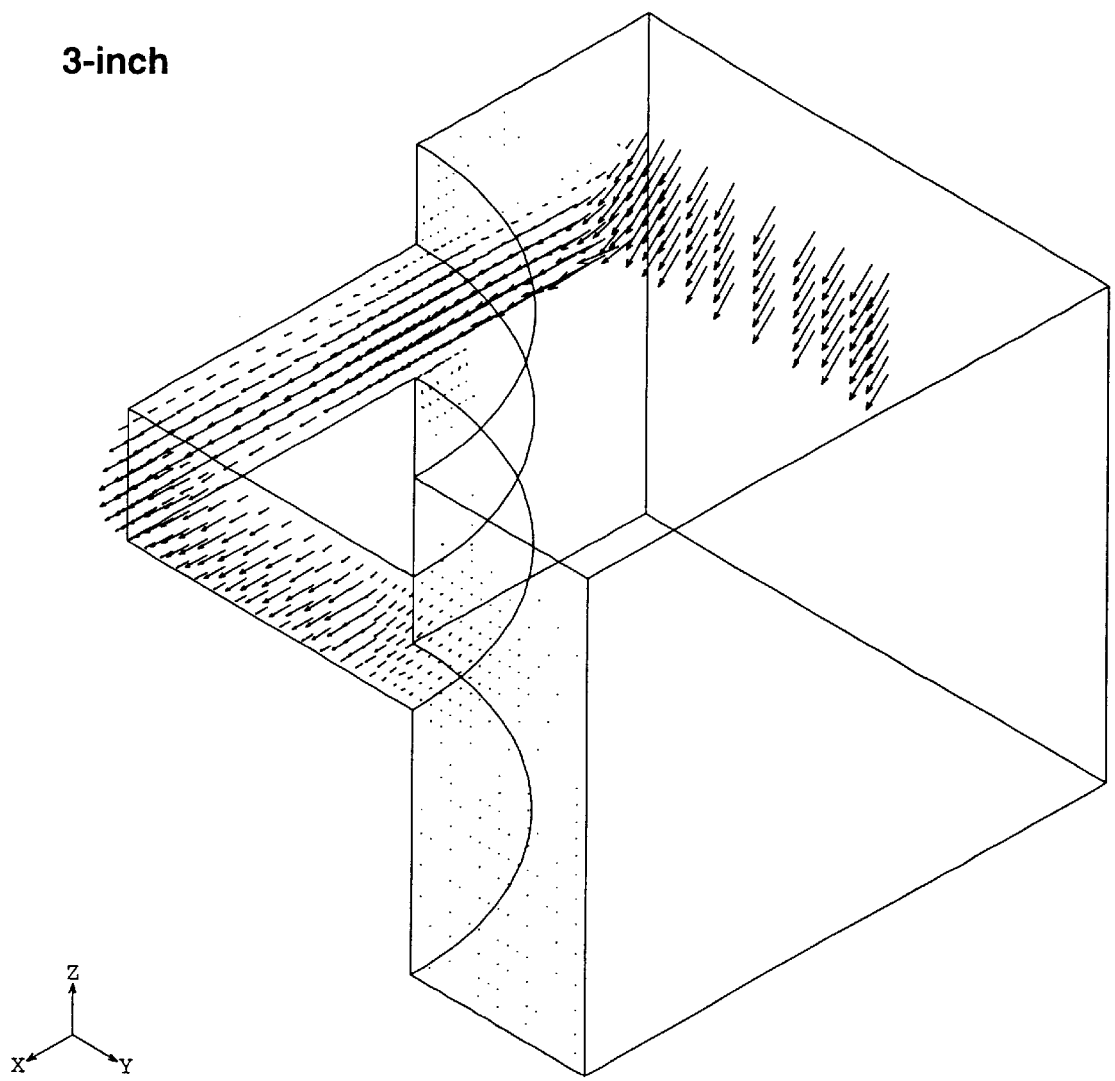
FIG. 6d shows a 3 in. plate.

The perpendicular-entry flow in FIGS. 5(a,b) can be more desirable than the oblique-entry flow in FIGS. 5(c,d) because perpendicular-entry flow can direct a greater proportion of the purge flow into the area of highest contamination, namely the region between the lid and the base of the processing module. A plate or shelf underneath the slit and along the edge of the slit can provide perpendicular-entry flow. If the slit is horizontal, the oblique flow entering from the slit is deflected to a more nearly horizontal angle. The degree of this deflection is related to the length of the plate or shelf. FIGS. 6(a,b,c,d) present velocity-vector plots for four flow calculations with plates of the following lengths: FIG. 6a shows a 0 in. plate (identical to FIG. 5a), FIG. 6b shows a 1 in. plate, FIG. 6c shows a 2 in. plate, and FIG. 6d shows a 3 in. plate. Substantial redirection of the flow is achieved with the 1 in. plate, fairly complete redirection is achieved with the 2 in. plate, and only a slight further improvement is achieved with the 3 in. plate. Since the jet width in these calculations is enforced to be the product of the slit width (2 in.) times cos 45°, which is about 1.4 in., this suggests that the plate length needed to achieve complete redirection is 1–2 jet widths. Accordingly, if the jet is thinner than the slit, a smaller plate or shelf can be employed.

Flow Vectoring and Jet Contraction

The direction and width of the jet flow entering the module bay from the slit affect the flow distribution in the module bay strongly. Once created, the jet travels straight along its initial direction until about 1–2 jet widths upstream of the processing module. Moreover, a plate of length about 1–2 jet widths can achieve substantially complete redirection of the jet. The width and direction of the jet are strongly determined by the purge flow rate, the external downward velocity, and the slit dimensions.

Figure 7A:
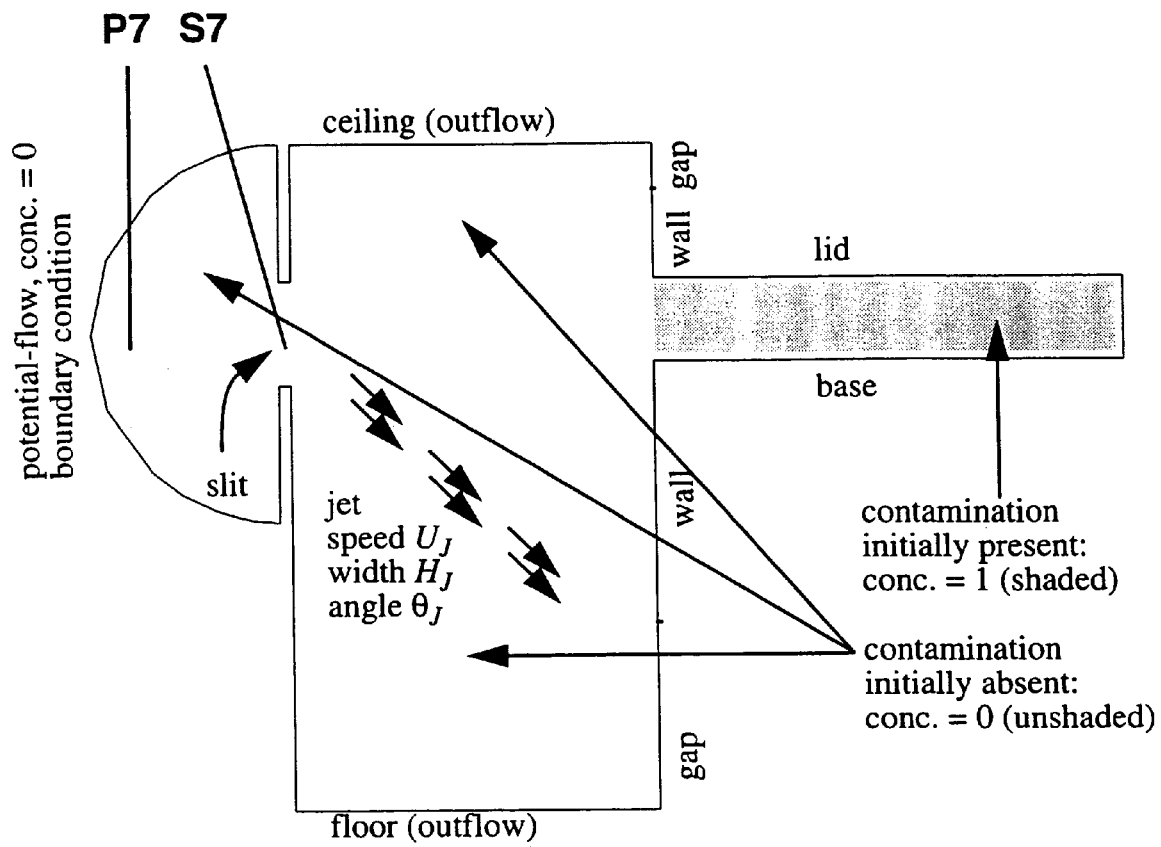
FIGS. 7(a,b) present the computational domain used for two-dimensional flow simulations.

Free-streamline potential-flow theory can be used to understand some aspects of jet behavior. Using these ideas suggest that the jet width $H_J$, speed $U_J$, and angle $\theta_J$ from horizontal (as shown in FIG. 7a) should behave approximately as in Equation 3.

$$\tan\theta_J \approx \left(\frac{\pi}{\pi+2}\right)\left(\frac{U_E}{U_0}\right);  \quad \text{Equation 3}$$

$$\left(\frac{H_J}{W_0}\right) = \left(\frac{U_J}{U_0}\right)^{-1} \approx \left(\frac{\pi}{\pi+2}\right)\cos\theta_J$$

In Equation 2, $W_0$ is the slit width, $U_E$ is the external downward velocity, and $U_0=V'/(S_0 W_0)$ is the average flow speed through the slit. These arguments can be extended to treat the interaction of such a jet with a vertical wall (i.e. the upstream edge of the processing module). In this interaction, the jet divides into two jets, which travel vertically upward (+) and downward (–) along the wall at the jet speed $U_J$ and have widths of $B_\pm$, as in Equation 4.

$$\frac{B_\pm}{W_0} \approx \left(\frac{\pi}{\pi+2}\right)\left(\frac{\cos\theta_J}{2}\right)(1 \mp \sin\theta_J) \quad \text{Equation 4}$$

These relations assume that the wall with the slit is infinitely thin. A thicker wall (where "thick" is relative to the jet width) can reduce the jet angle from the value predicted by Equation 3.

If $U_E<<U_0$, Equation 3 indicates that the jet enters almost horizontally (only minimal flow vectoring) but contracts to approximately 0.61 of its original width. The jet speed increases commensurately to 1.64 times the average flow speed through the slit. If $U_E>>U_0$, Equation 3 indicates that the jet speed approaches the external downward velocity. The jet width is substantially reduced from the slit width by the factor $U_0/U_E$, which is a small number in this limit by definition. Equation 3 also indicates that the jet angle is not small in this limit, indicating that substantial flow vectoring occurs. Table 2 shows predictions of jet behavior based on Equations 3 and 4 for the parameter values in Table 1. For both purge flow rates considered, substantial flow vectoring and jet contraction are predicted. Jet contraction is fairly independent of the presence or absence of a shelf.

TABLE 2

| Quantity | At V' = 4 ft³/min | At V' = 2 ft³/min |
| --- | --- | --- |
| $\theta_J$ | 32° | 52° |
| $H_J$ | 0.57 in. | 0.42 in. |
| $U_J$ | 112 ft/min | 77 ft/min |
| $B_+$ | 0.13 in. | 0.05 in |
| $B_-$ | 0.44 in. | 0.37 in. |

Figure 7B:
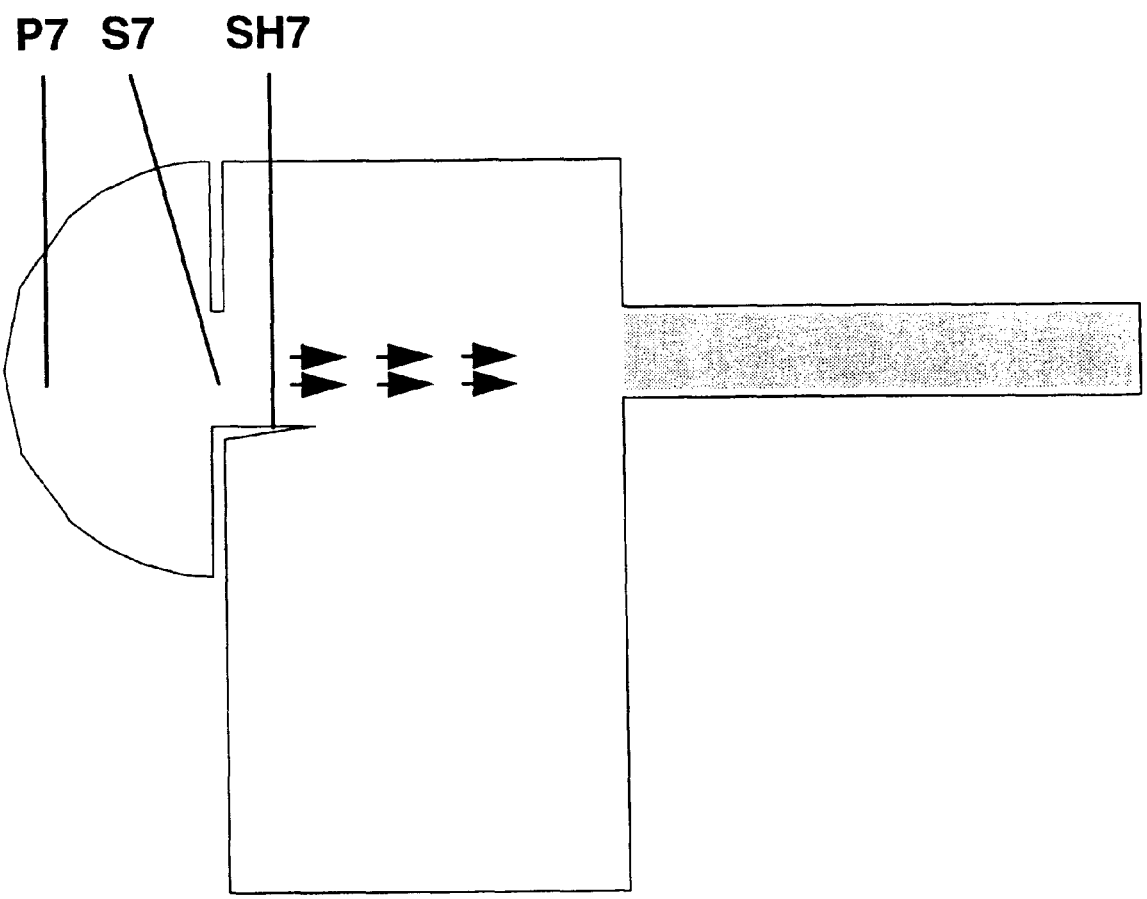

To assess the impact of flow vectoring and jet contraction on purging, two-dimensional flow simulations were performed using FIDAP. FIGS. 7(*a,b*) present the computational domain used for the two-dimensional flow simulations. The computational domain in FIGS. 7(*a,b*), was taken to lie in the vertical plane through the module bay defined by the dashed line of FIG. 2 and was developed using the parameter values in Table 1. Since the upstream portion of the module is the main source of possible contamination, only this portion of the geometry was included in the simulation. A semicircular portion P7 of the computational domain exterior to and centered on slit S7 was included so that the flow passing through slit S7 would be determined as part of the computation rather than being imposed as a boundary condition. The boundary condition on the semicircle was taken to be a linear combination of the potential-flow solutions for uniform downward flow at the prescribed velocity $U_E$ and for radially inward flow toward a sink yielding the prescribed purge flow rate V'. Outflow was allowed through the gaps above the lid, below the base, after flowing through region between the lid and the base, and through the floor and the ceiling. The reason for allowing outflow through the floor and the ceiling was that this was the only set of boundary conditions found to allow enough pressure relief to prevent spurious deflection of the jet, as discussed in the previous section. A shelf SH7 to redirect the flow could also be included in the computational domain, as shown in FIG. 7*b*. Steady computations were performed to determine the flow field. Subsequently, transient contamination-transport computations were performed to determine the purging behavior.

The initial contamination conditions, shown in FIG. 7*a*, were conservatively chosen to be pure contaminant (a concentration of 1) between the base and the lid and no contamination (a concentration of 0) elsewhere. A purging time of 1 minute was considered.

Computations were performed for a wide variety of operational and geometric conditions. FIGS. 8–11 show some flow and contaminant-transport calculations for a slice through a generic module bay. In the figures, the slit orifice is 1.1 inches wide and 9 inches long (out of the plane of the figures), the lid-base gap is 0.875 inches and not directly aligned with the slit orifice, and the downward flow in the main bay has a velocity of 60 ft/min. In each figure, a particular shelf configuration is considered: no shelf in FIG. 8, a horizontal shelf in FIG. 9, an elevated shelf in FIG. 10, and a more highly elevated shelf in FIG. 11. Each figure shows flow and contaminant-transport calculations for two flow rates and four times: 4 ft³/min and 2 ft³/min for the leftmost and rightmost columns of four plots; and 0.06 s, 0.6 s, 6 s, and 60 s. The top plot in each column shows the flow streamlines as white curves. Although this streamline pattern is not shown in the lower three plots of each column, the flow is still present (and unchanged from the upper plot). The color shows the air composition throughout the module bay at the indicated time: blue indicates pure cleanroom air, and red indicates air present in the module interior at 0 s (i.e., potentially contaminated air). The green contours indicate module-interior-air concentrations of 1 part per billion (leftmost contour), 1 part per million (middle contour), and 1 part per thousand (rightmost contour).

Figure 8:
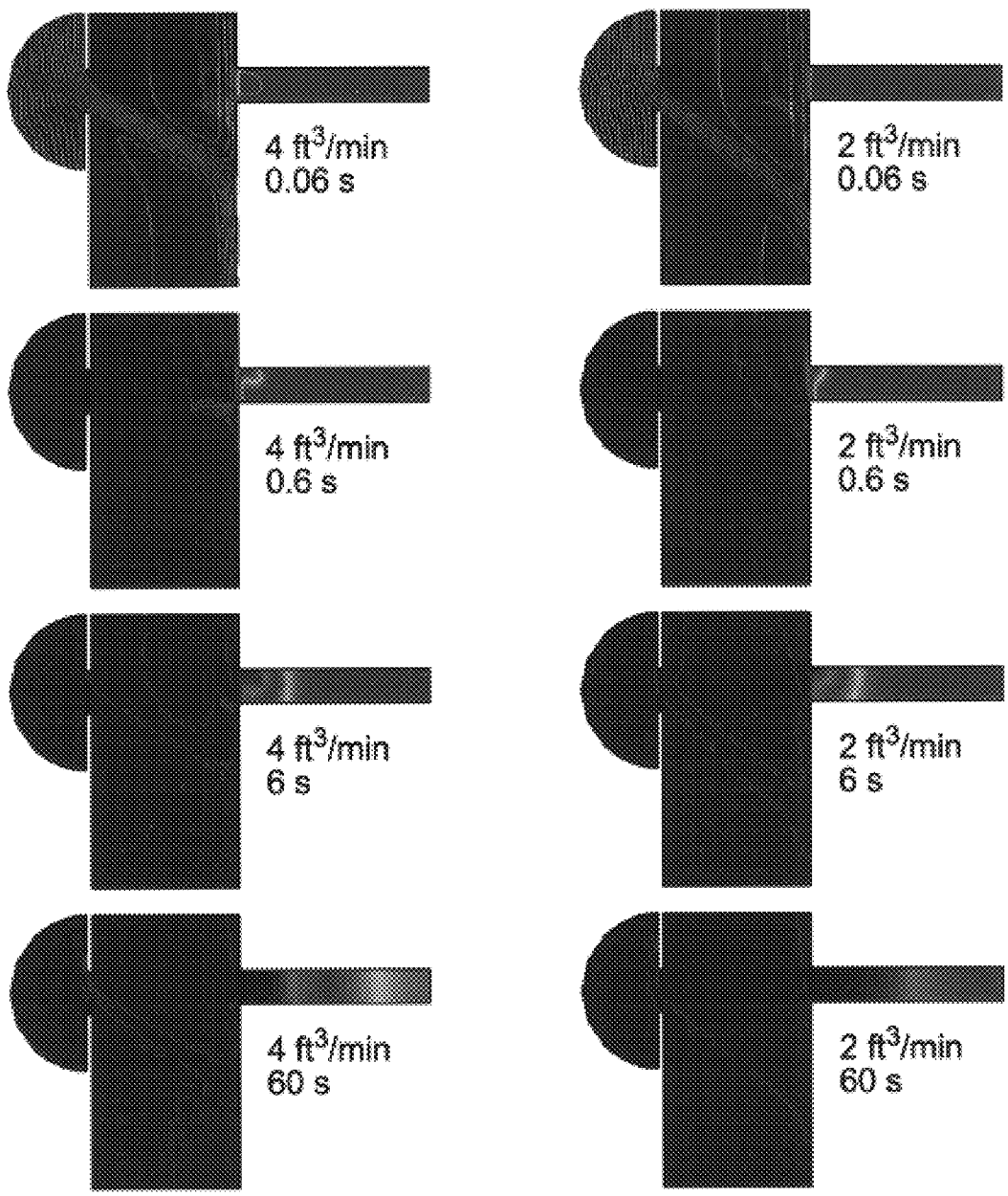
FIGS. 8, 9, 10, and 11 present results of calculations at purge rates of 4 ft$^3$/min and 2 ft$^3$/min (58 ft/min and 29 ft/min) for a conventional module bay geometry and three others with shelf configurations according to the present invention.

FIG. 8 shows the flow patterns with no shelf present. Due to the strong downward flow in the main bay, the flow entering the module bay travels obliquely downward and mostly bypasses the lid-base gap. The flow in the lid-base gap is nearly quiescent, and a significant fraction of the air originally present in this region is still there even after 60 s, which is longer than typical unloading/loading times. As a result, any contaminant originally present in the lid-base gap could potentially be transported out into the main bay during unloading/loading. Attempting to reduce the purge flow rate from 4 ft³/min to 2 ft³/min is seen to exacerbate this problem.

Figure 9:
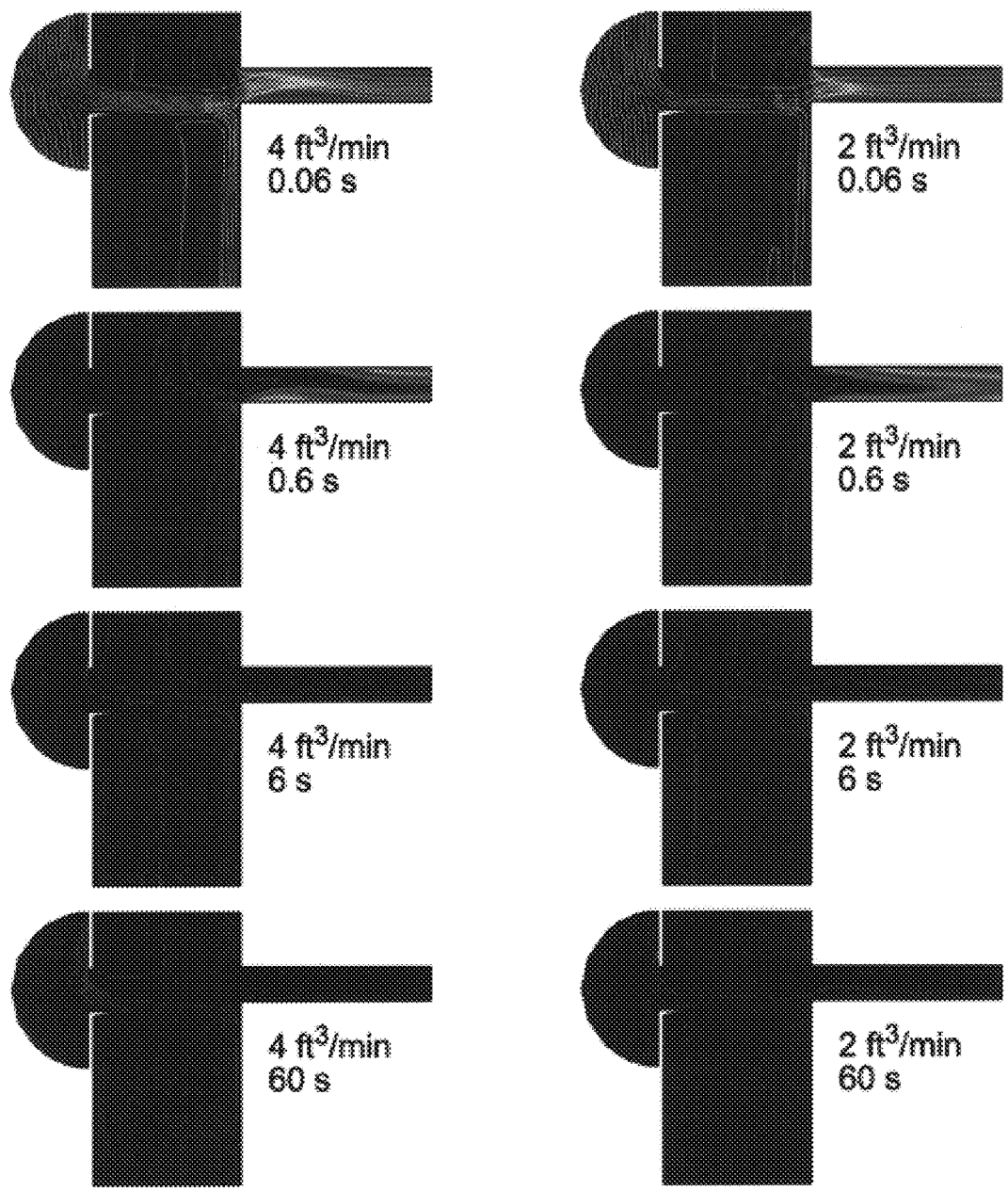

FIG. 9 shows the flow patterns with a horizontal shelf present. Although the strong downward flow is still present in the main bay, the bulk of the flow travels almost horizontally toward the processing module, and a significant portion enters the lid-base gap. Due to the misalignment between the slit orifice and the gap, some of the flow is deflected downward by the processing module base. Because of the significant flow passing through the lid-base gap, purging is greatly improved. A large portion of the processing module-interior air is removed by 0.6 s, and processing module-interior-air concentrations are around or below 1 part per thousand after only 6 s even when the flow through the slit orifice is only 2 ft³/min.

Figure 10:
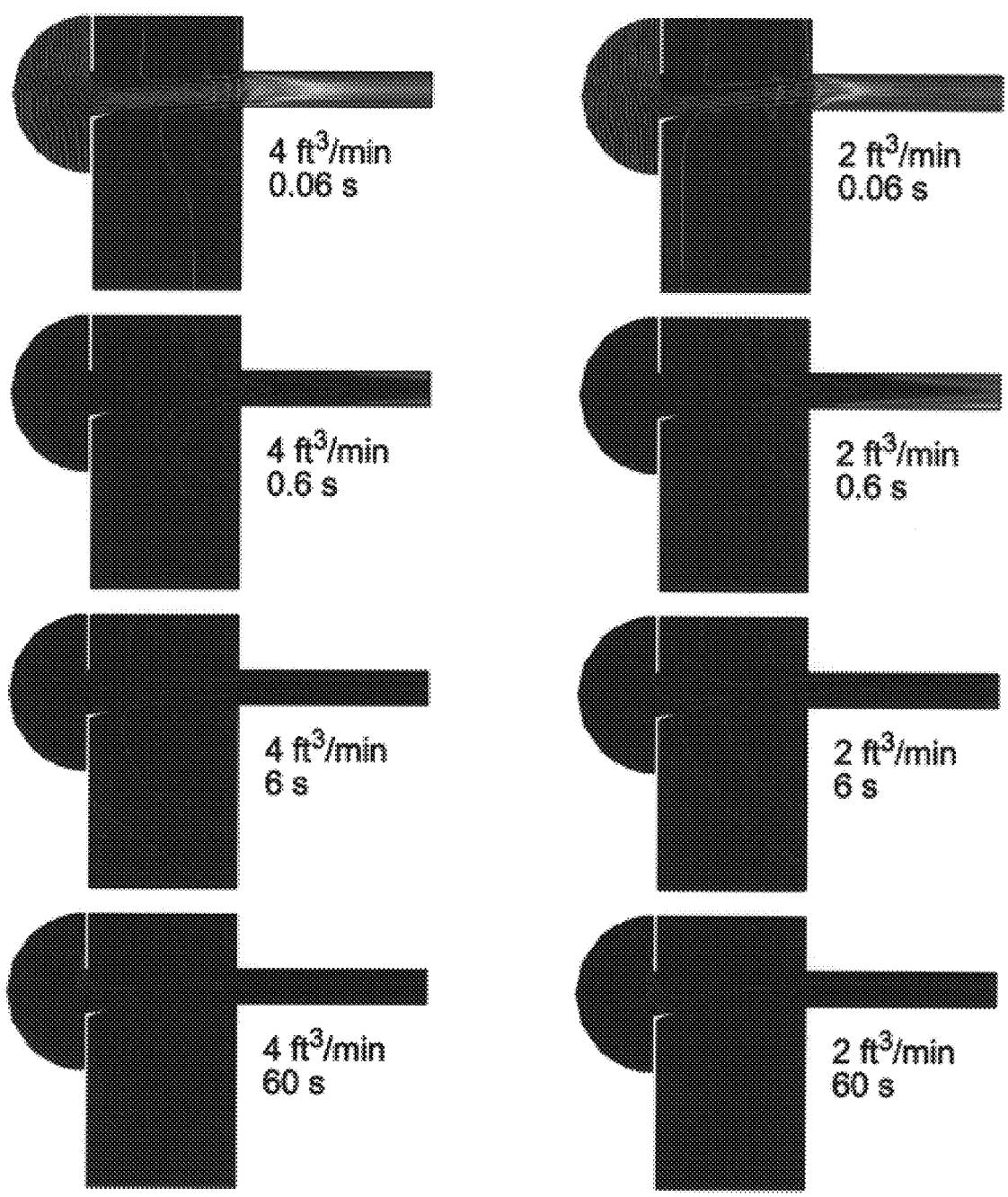

FIG. 10 shows the flow patterns with an elevated shelf present. This shelf configuration resulted from numerous calculations and directs essentially all of the flow into the lid-base gap despite the strong downward flow in the main bay. A substantial fraction of the original processing module interior air is removed as early as 0.6 s, and processing module-interior-air concentrations are around or below 1 part per million after only 6 s even when the flow through the slit orifice is only 2 ft³/min.

Figure 11:
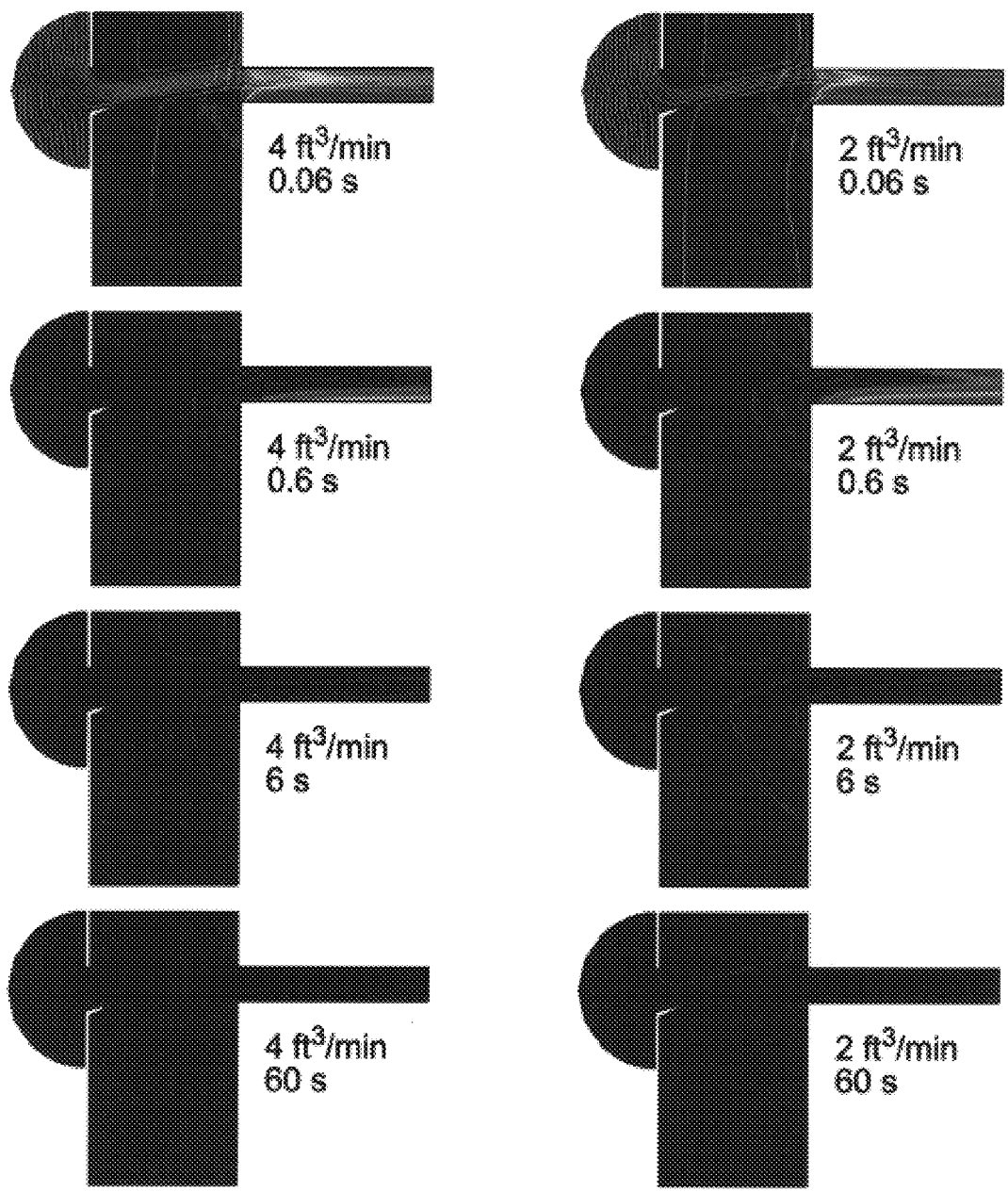

FIG. 11 shows the flow patterns with a more highly elevated shelf present. This shelf configuration directs most of the flow into the lid-base gap despite the strong downward flow in the main bay. A substantial fraction of the original processing module interior air is removed as early as 0.6 s, and processing module-interior-air concentrations are around or below 1 part per million after only 6 s even when the flow through the slit orifice is only 2 ft³/min.

Several observations can be made about these results. In the conventional geometry (FIG. 8), substantial flow vectoring and jet contraction occur for both purge rates. The jet widths, speeds, angles, and wall interactions are comparable to the predictions of Equations 3–4 although the angles are somewhat smaller than expected, particularly for the smaller purge rate. Based on additional simulations not shown, this appears to be related to the thickness of the wall with the slit (here, ⅛ in.): making this wall thinner was found to increase the jet angles slightly. Contamination is seen to enter the originally uncontaminated areas while being convected out the end of the region between the lid and the base. However, an appreciable fraction of the original contamination level remains within the region between the base and the lid even after 1 minute of purging for both purge rates. Although the contamination concentration outside the slit is still around or below 1 part per billion even after 1 minute, the robot arm samples much higher contamination levels in the region between the base and the lid as it loads and unloads wafers and thus has the potential to transport this contamination directly back into the main bay, which is undesirable.

The three modified geometries (shown in FIGS. 9–11) employ shelves that are 1 in. long but with slightly different tip elevations to redirect the purge flow toward the region of highest contamination, namely the region between the lid and the base. In all cases redirection is successfully achieved. As a result, in all three modified geometries, the concentration is below 10 parts per thousand everywhere in the domain (often orders of magnitude lower) after 6 s, with further reductions at later times. The best purging appears to be achieved by the modified geometry with the most "accurate" flow redirection (shown in FIG. 10). The geometry shown in FIG. 11, in which the flow is redirected slightly higher, has comparably good purging.

The best purging was obtained by the widest jet that could be produced. Although the jet can be widened by widening the slit, the effect is not large for the purge rates considered here because the external downward velocity is large compared to the average velocity through the slit. Also, a shelf length of about 1 in. was found to be satisfactory: shorter shelves did not produce enough flow redirection, and longer shelves produced only marginally more flow redirection.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

What is claimed is:

1. A module bay adapted for use in a processing apparatus, comprising walls surrounding and defining a module bay volume, said walls adapted to accommodate a processing module within said module bay volume, said walls having a gas outlet passage and a gas inlet passage therethrough, wherein said gas inlet passage is adapted to direct gas flowing therethrough preferentially toward contaminant-rich portions of said processing module before leaving said module bay volume through said gas outlet passage, wherein said gas inlet passage comprises a slit through a first of said walls and a shelf mounted with said first wall, wherein said shelf has a surface proximal to said slit and wherein said surface is substantially directed toward contaminant-rich portions of said processing modules.

2. A module bay according to claim 1, wherein said slit has a height measured substantially parallel to gas flow proximal said module bay when said module bay is in operation with said processing apparatus, and wherein said shelf extends from said slit a distance of at least ½ said height.

3. A module bay according to claim 1, wherein said slit has a height measured substantially parallel to gas flow proximal said module bay when said module bay is in operation with said processing apparatus, and wherein said shelf extends from said slit a distance of at least said height.

4. A module bay adapted for use in a processing apparatus, comprising walls surrounding and defining a module bay volume, said walls adapted to accommodate a processing module within said module bay volume, said walls having a gas outlet passage and a gas inlet passage therethrough, wherein said gas inlet passage is adapted to direct gas flowing therethrough preferentially toward contaminant-rich portions of said processing module before leaving said module bay volume through said gas outlet passage, wherein said walls define a substantially polyhedral module bay volume, and wherein said processing module comprises a base and a lid wherein said contaminant-rich portion comprises a portion adjacent a junction between said base and said lid, and wherein said gas inlet passage comprises a slit through a first of said walls and a shelf mounted with said first wall, wherein said shelf has a surface proximal to said slit and wherein said surface is substantially directed toward said junction.

5. A module bay according to claim 4, wherein said slit has a height measured substantially parallel to gas flow proximal said module bay when said module bay is in operation with said processing apparatus, and wherein said shelf extends from said slit a distance of at least ½ said height.

6. A module bay according to claim 4, wherein said slit has a height measured substantially parallel to gas flow proximal said module bay when said module bay is in operation with said processing apparatus, and wherein said shelf extends from said slit a distance of at least said height.

7. A module bay according to claim 4, wherein said slit is substantially aligned with said junction, and wherein said surface is directed above the midpoint of said junction.

8. A module bay according to claim 7, wherein said slit has a height measured substantially parallel to gas flow proximal said module bay when said module bay is in operation with said processing apparatus, and wherein said shelf extends from said slit a distance of at least ½ said height.

9. A processing apparatus, comprising:
a) a main bay;
b) a module bay in fluid communication with said main bay, comprising walls defining a module bay volume, said module bay volume adapted to accommodate a processing module therein, wherein said module bay comprises
i) a gas outlet passage through said walls;
ii) a gas inlet passage through said walls allowing gas passage from said main bay into said module bay volume, wherein said gas inlet passage is adapted to direct gas flowing therethrough preferentially toward contaminant-rish portions of said processing module before leaving said module bay volume through said gas outlet passage, and wherein said gas inlet passage comprises a slit through a first of said walls and a shelf mounted with said first wall, wherein said shelf has a surface proximal to said slit and wherein said surface is substantially directed toward contaminant-rich portions of said processing module;
c) a gas supply subsystem in fluid communication with said main bay; and
d) a gas exhaust subsystem in fluid communication with said gas outlet passage, wherein said gas inlet passage comprises a slit through a first of said walls and a shelf mounted with said first wall, wherein said shelf has a surface proximal to said slit and wherein said surface is substantially directed toward contaminant-rich portions of said processing module.

10. A processing apparatus according to claim 9, wherein said slit has a height measured substantially parallel to gas flow proximal said module bay when said module bay is in operation with said processing apparatus, and wherein said shelf extends from said slit a distance of at least ½ said height.

11. A processing apparatus according to claim 9, wherein said slit has a height measured substantially parallel to gas flow proximal said module bay when said module bay is in operation with said processing apparatus, and wherein said shelf extends from said slit a distance of at least said height.

12. A processing apparatus, comprising:
a) a main bay;
b) a module bay in fluid communication with said main bay, comprising walls defining a module bay volume, wherein said walls define a substantially polyhedral module bay volume, said module bay volume adapted to accommodate a processing module therein, wherein said processing module comprises a base and a lid, wherein said module bay comprises
  i) a gas outlet passage through said walls;
  ii) a gas inlet passage through said walls allowing gas passage from said main bay into said module bay volume, wherein said gas inlet passage is adapted to direct gas flowing therethrough preferentially toward contaminant-rish portions of said processing module before leaving said module bay volume through said gas outlet passage, wherein said contaminant-rich portion comprises a portion adjacent a junction between said base and said lid, and wherein said gas inlet passage comprises a slit through a first of said walls and a shelf mounted with said first wall, wherein said shelf has a surface proximal to said slit and wherein said surface is substantially directed toward said junction;
c) a gas supply subsystem in fluid communication with said main bay; and
d) a gas exhaust subsystem in fluid communication with said gas outlet passage, wherein said gas inlet passage comprises a slit through a first of said walls and a shelf mounted with said first wall, wherein said shelf has a surface proximal to said slit and wherein said surface is substantially directed toward contaminant-rich portions of said processing module.

13. A processing apparatus according to claim 12, wherein said slit has a height measured substantially parallel to gas flow proximal said module bay when said module bay is in operation with said processing apparatus, and wherein said shelf extends from said slit a distance of at least ½ said height.

14. A processing apparatus according to claim 12, wherein said slit has a height measured substantially parallel to gas flow proximal said module bay when said module bay is in operation with said processing apparatus, and wherein said shelf extends from said slit a distance of at least said height.

15. A processing apparatus according to claim 12, wherein said slit is substantially aligned with said junction, and wherein said surface is directed above the midpoint of said junction.

16. A processing apparatus according to claim 15, wherein said slit has a height measured substantially parallel to gas flow proximal said module bay when said module bay is in operation with said processing apparatus, and wherein said shelf extends from said slit a distance of at least ½ said height.

* * * * *